US008350730B2

(12) United States Patent
Siepmann

(10) Patent No.: US 8,350,730 B2
(45) Date of Patent: *Jan. 8, 2013

(54) KEYBOARD SCAN

(75) Inventor: Simon Siepmann, Essen (DE)

(73) Assignee: Infineon Technologies AG, Neubiberg (DE)

( * ) Notice: Subject to any disclaimer, the term of this patent is extended or adjusted under 35 U.S.C. 154(b) by 1479 days.

This patent is subject to a terminal disclaimer.

(21) Appl. No.: 11/856,728

(22) Filed: Sep. 18, 2007

(65) Prior Publication Data

US 2008/0316067 A1 Dec. 25, 2008

Related U.S. Application Data

(63) Continuation of application No. 11/767,334, filed on Jun. 22, 2007.

(51) Int. Cl.
*H03M 11/00* (2006.01)

(52) U.S. Cl. ............... 341/28; 341/20; 341/22; 341/24; 341/25; 341/26; 710/67; 710/73; 178/17 C

(58) Field of Classification Search .............. 341/20–35; 340/14.1; 710/67, 73; 178/17 C
See application file for complete search history.

(56) References Cited

U.S. PATENT DOCUMENTS

| 4,405,917 | A  | * | 9/1983 | Chai ........................... 341/26 |
| 5,220,323 | A  | * | 6/1993 | Ito et al. ..................... 341/24 |
| 7,158,056 | B2 | * | 1/2007 | Wright et al. ................ 341/26 |
| 2008/0088488 | A1 | * | 4/2008 | Siepmann ..................... 341/22 |

* cited by examiner

*Primary Examiner* — George Bugg
*Assistant Examiner* — Franklin Balseca
(74) *Attorney, Agent, or Firm* — SpryIP, LLC

(57) ABSTRACT

Methods, apparatuses, and computer-readable media for scanning a keyboard are disclosed. Actuation of each of the keys electrically couples one of a plurality of first lines and one of a plurality of second lines. A first signal is applied to a plurality of first lines. A second signal is applied to a plurality of second lines. Upon identifying at least one of the second lines as presenting a signal different from the second signal, a scan signal is applied to the identified second line. At least one first line is identified as presenting a signal indicating the at least one first line is contact with the identified second line applying the scan signal. At least one of the keys is identified as causing the identified second line and the least one identified first line to be coupled.

21 Claims, 17 Drawing Sheets

KEYBOARD SCAN

BACKGROUND

A common type of keyboard-type input device includes an array of signal lines arranged in a series of overlapping rows and columns. The rows and columns of signal lines are positioned to closely pass by each other at a plurality of intersecting positions, with each of the intersecting positions being situated beneath a key on the keyboard. Pressing a key on the keyboard causes the row line and column line passing each other at the intersecting position beneath the key to come in contact with one another, thus closing a switch formed by the row line and the column line passing beneath that key. In compact devices, the keyboard typically includes two sets of foil strips aligned at right angles to each other, such that when a key is pressed, the intersecting foil strips are pressed together to close the switch at the point of intersection.

In a conventional process for scanning such a keyboard, a signal is applied sequentially to each of one of the sets of signal lines while reading the opposing set of signal lines to determine which key or keys have been pressed. For example, a signal in the form of a high-level voltage representing a binary 1 may be sequentially applied to each of the column lines. The row lines are monitored to detect a signal indicating that one or more of the row lines presents the high-level signal, indicating that row line has become electrically coupled with a column line to which the high-level signal has been applied. By detecting the change on one of the row lines and determining to what column the signal was applied, one can determine which column line and which row line came in contact to identify which key was pressed.

Conventional keyboard scans, however, have shortcomings. First, and of particular concern in battery-powered devices, the longer that a signal has to be applied in identifying which key is pressed, the more power will be consumed in scanning the keyboard. Particularly when multiple keys are pressed simultaneously, both the current flowing through the coupled signal lines and the current used to power the keyboard scanning system consume appreciable power. Second, the signals applied to the keyboard may result in uncontrolled short-circuits. In compact devices using foil-type keyboard, the closely-spaced foil strips may short-circuit, thereby both wasting power and give false key press signals. Third, the pressing of a key can result in signal crosstalk between adjacent lines that leads to erroneous identification of which key or keys were pressed. Signal crosstalk is common in compact, foil-type keyboards because of the short distances between the row lines and column lines in contrast to the relatively much longer signal lines they may connect.

BRIEF DESCRIPTION OF THE DRAWINGS

Non-limiting and non-exhaustive implementations of the present disclosure are described with reference to the following drawings.

Figure 1:
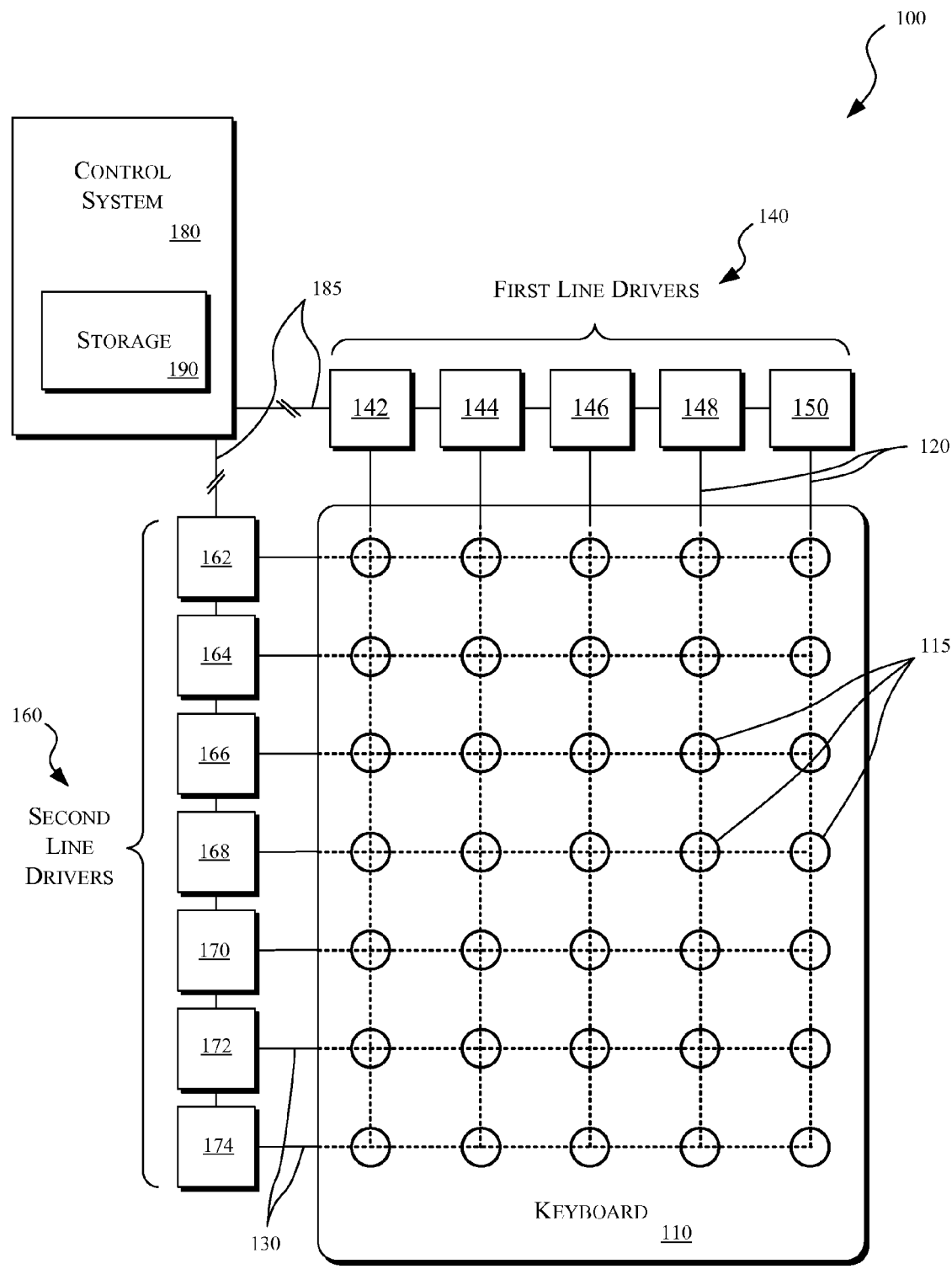
FIG. 1 is a block diagram of a keyboard system configured for an implementation of the keyboard scan.
Figure 2:
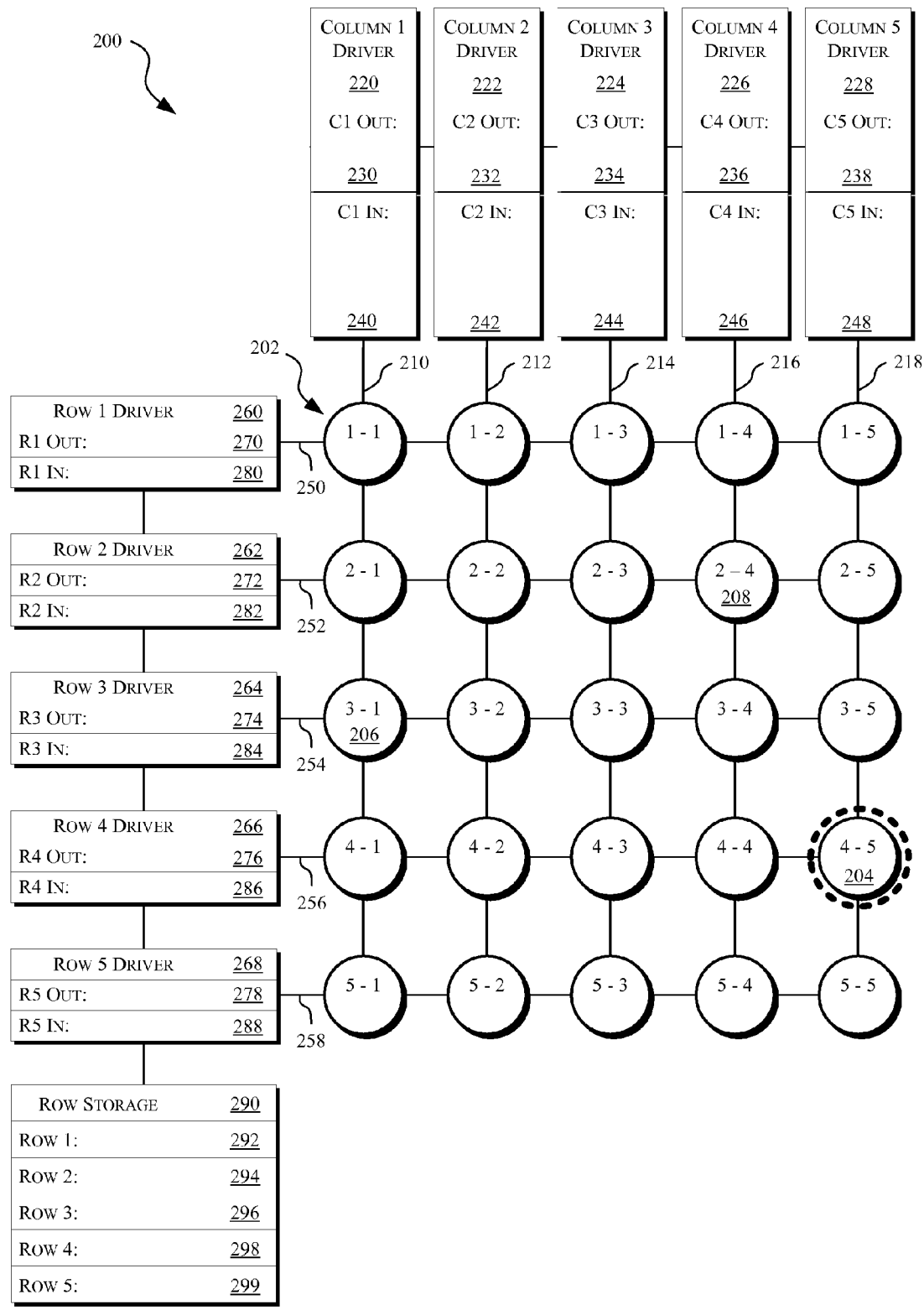
FIGS. 2-9 are blocks diagrams of a keyboard system depicting operation of an implementation of a keyboard scan.

In the drawings, the first digit in three-digit reference numerals and the first two-digits in four-digit reference numerals refer to the figure in which the referenced element first appears.

DETAILED DESCRIPTION

Various embodiments of the present disclosure will be described in detail with reference to the drawings, where like reference numerals represent like parts and assemblies throughout the several views. Reference to various embodiments does not limit the scope of the disclosure, which is limited only by the scope of the claims attached hereto. Additionally, examples set forth in this specification are not intended to be limiting and merely set forth some of the many possible embodiments contemplated in the present disclosure.

Briefly stated, the present disclosure is related to methods, computer-readable storage media, and apparatuses for scanning a keyboard. Actuation of each of the keys electrically couples one of a plurality of first lines and one of a plurality of second lines. A first signal is applied to a plurality of first lines. A second signal is applied to a plurality of second lines. Upon identifying at least one of the second lines as presenting a signal different from the second signal, a scan signal is applied to the identified second line. At least one first line is identified as presenting a signal indicating the at least one first line is contact with the identified second line applying the scan signal. At least one of the keys is identified as causing the identified second line and the least one identified first line to be coupled.

In the scanning sequence, a short-circuit of brief duration is used to clear signal crosstalk. The second signal is then reapplied to the second signal lines and a detected signal value is determined for each of the second signal lines. Each of the second signal lines for which a detected value is different from the second signal is identified as being a line in which at least one key is pressed, and the identified second lines are designated to be individually scanned.

Keyboard Scanning System for Implementing a Keyboard Scan

FIG. 1 is a block diagram of a keyboard system 100 configured to employ an implementation of the keyboard scan. The keyboard system 100 includes a keyboard 110 that, for example, may include a foil-contact type keyboard as previously described that is used in many electronic devices. The keyboard 110 includes a plurality of keys 115, a plurality of first lines 120, presented in columns, and a plurality of second lines 130, presented in rows. As previously described, pressing of one of the keys 115 results in an electrical contact being made between a respective first line 120 and a respective second line 130 that intersect at that key.

The first lines 120 are coupled with a set of first line drivers 140. The first line drivers 140 may be implemented as single driver circuit or, as shown in FIG. 1, a plurality of individual first line drivers 142-150. Similarly, the second lines 130 are coupled with a set of second line drivers 160. The second line drivers 160 also may be implemented as a single driver circuit or a plurality of individual second line drivers 162-174. Further alternatively, the first line drivers 140 and second line drivers 160 may be implemented as a single driver circuit or implemented as part of an integrated control system. Regardless of the manner in which the line drivers 140 and 160 are implemented, the line drivers 140 and 160 are used both to apply signal values to and to read signal values from the lines 120 and 130 to determine which key or keys 115 have been pressed.

A control system 180 is used to control the operation of the line drivers 140 and 160 as well as read the data from the line drivers 140 and 160. The control system 180 is coupled to the line drivers 140 and 160 using multi-bit control lines or control buses 185. The control system 180 determines what signals are applied to each of the lines 114 and 116 of the keyboard 110 and reads what signals are received at each of the lines 120 and 130.

The control system 180 may be implemented as an application-specific integrated circuit (ASIC), as a microprocessor or microcomputer executing programmed instructions, or using other forms of control circuitry. In addition, the line drivers 140 and 160 and the control lines 185 may be integrated with the control system 180 to form a single device operable to engage the lines 120 and 130 for scanning the keyboard 110.

In one implementation, the control system 180 includes storage 190 for use in storing signal values read from the line drivers 140 and 160. As described in more detail with regard to FIGS. 2-15, the storage 190 may be used to store data indicating when one of the sets of lines 120 and 130 receives a signal indicating that one or more of the keys 115 associated with the lines 120 and 130 have been pressed. As described with reference to FIGS. 10-15 and the storage 190 may be used in detecting key masking situations. The storage 190 could be maintained within the control system 180 as shown in FIG. 1, as a separate device, or as part of the line drivers 140 and 160.

The devices shown in FIG. 1 are coupled to a power source (not shown). The power source is configured to provide a high-level voltage source and a low-level voltage source to provide operating power for the devices. The high-level voltage source and the low-level voltage source also provide a source for signals to be applied to the lines 120 and 130 in scanning the keyboard 110 as further described below. Also, the control system 180 will be coupled with a device (not shown in FIG. 1) that receives input from the keyboard 110. Alternatively, the control system 180 and other devices, such as the line drivers 140 and 160 with which control system 180 communicates, may be integrated within a computing system or other electronic device with which the keyboard 110 is associated. In other words, implementations of the keyboard scan are not limited to one or more specific hardware implementations. Instead, the keyboard scan may be implemented by any system operable to perform the measures described below.

Operational Example of a Keyboard Scan

FIGS. 2-15 are blocks diagrams of a keyboard system depicting operation of an implementation of a keyboard scan. The keyboard system 200 includes a plurality of keys 202 arranged in an array of rows and columns. Each of the keys 202 is situated within a particular row and a particular column. To this end, each of the keys 202 is labeled with a two-digit designation to represent in what row and in what column it is disposed. For example, key 4-5 204 is situated in the fourth row and fifth column of the keyboard 200. Similarly, key 3-1 206 204 is situated in the third row and first column of the keyboard 200, while key 2-4 208 is situated in the second row and fourth column of the keyboard 200.

Each of the column lines 210-218 column and each of the row lines 250-258 is associated with one of a plurality of column drivers 220-228 and row drivers 260-268, respectively, although each of the drivers 220-228 and 260-268 could be implemented in combined circuitry as previously described. Each of the column drivers 220-228 and row drivers 260-268 includes an output section 230-238 and 270-278 and an input section 240-248 and 280-288, respectively. Each of the output sections 230-238 and 270-278 controls what source signal is applied to the line to which it is coupled. The source signal applied may include an active high-level signal or an active low-level signal generated by coupling the respective lines to a voltage source of a high-level or low-level, respectively. Alternatively, the source signal applied may include a passive high-level signal generated by coupling the respective line to a high-level signal via a "pull-up" resistor (not shown in the figures) or a passive low-level signal generated by coupling the respective line to a low level signal via a "pull-down" resistor (also not shown in the figures). The input sections 240-248 and 280-288 are used to read a signal presented on a line, as further described below.

In implementations of the keyboard scan, the output sections 270-278 and the input sections 280-288 of the row drivers 260-268 may or may not both be used at the same time, and the output sections 230-238 and the input sections 240-248 of the column drivers 220-228 may or may not both be used at the same time. Specifically, as described in the foregoing example, the output sections 230-238 of the column drivers 220-228 may be used to apply an active high-level signal to each of the column lines 210-218 to apply a source signal to the column lines 210-218. To determine whether any of the keys 202 has been pressed, the output sections 270-278 of the row drivers 260-268 apply a passive, low-level signal to each of the row lines 250-258, such as by coupling the row lines 250-258 to a low-level signal with a pull-down resistor. At the same time, the input sections 280-288 of the row drivers 260-268 monitor signals detected on the row lines 250-258 to detect whether a key has been pressed.

To take a specific example, it will be assumed that key 4-5 204 is about to be pressed. The column 5 output 238 of the column 5 driver 228 applies an active, high-level signal to column line 5 218. At the same time, the row 4 output 276 of the row 4 driver 286 applies a passive, low-level signal to row line 4 256. Then, when key 4-5 204 is pressed (as indicated by the dashed line circling key 4-5 204), column line 5 218 becomes electrically coupled with row line 4 256. The active high-level signal applied to column line 5 218 is then applied to row line 4 256, raising the voltage level on row line 4 256. The row 4 input 286 detects the change in voltage. Thus, the output sections 230-238 and 270-278 and input sections 240-248 and 280-288, for at least one of the sets of lines 210-218 and 250-258, may be used at the same time.

The keyboard system 200 also includes at least one storage device which, in this example, is a row storage device 290 that includes row registers 292-299. As explained further with reference to FIG. 5, when a voltage-level change is detected on row line 4 256, this fact is stored to indicate that row line 4 256 should be scanned. To store this information, a status bit in the row 4 register 298 may be set to a high-level signal or a binary 1. In one implementation, the value stored in each of the row registers 292-299 initially is a binary 0 and the values are changed to a binary 1 when a key press is detected on the respective row line. Alternatively, a binary 1 could be used as the initial value and a binary 0 used to signal that a key has been pressed in a row line. As explained below with reference to FIGS. 10-15, the row storage 290 may also be used in determining when a key masking situation exists that may create an indeterminate scan result and/or dictate that a new scan is appropriate.

FIGS. 2-9 illustrate a specific example in which two keys are pressed simultaneously. Implementations of the keyboard scan are functional to identify the pressing of a single key. However, the example of two keys being pressed illustrates advantages of implementations of the keyboard scan herein disclosed. Implementations of the keyboard scan accurately identify the keys that are pressed, reduce power consumption, overcome the effects of signal crosstalk, and avoid uncontrolled short-circuits arising in the keyboard system.

Figure 3:
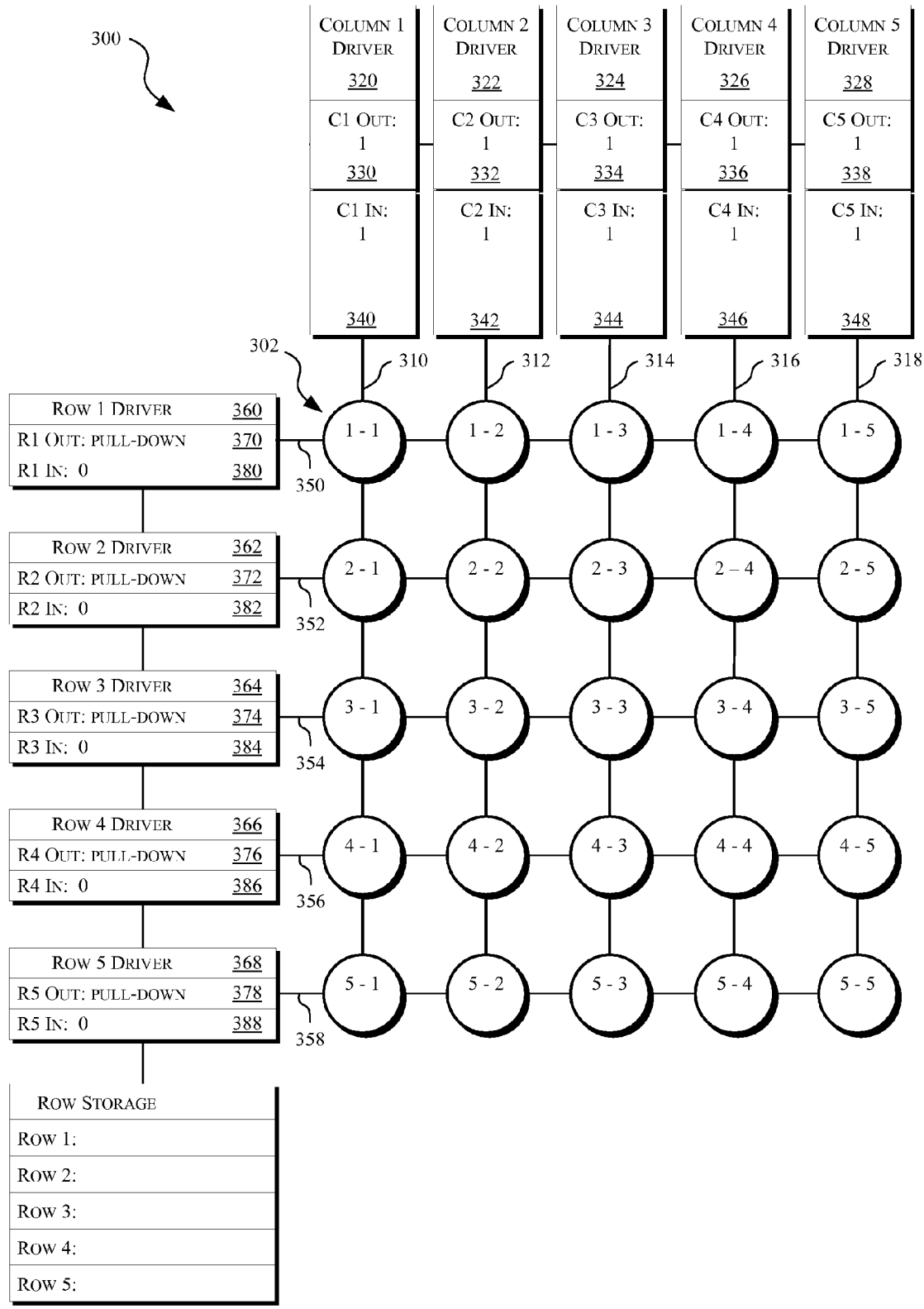

FIG. 3 shows an initial phase of a keyboard system 300 before any of the keys 302 have been pressed. In this example, the column lines 310-318 are used to send signals while the row lines 350-358 are used to receive signals to determine when one or more of the keys 302 have been pressed. In the keyboard system 300, the output sections 330-338 of the column drivers 320-328, for example, apply a high-level signal to the column lines 310-318. The input sections 340-348 need not be used during this initial phase because the voltage level on the column lines 310-318 is known. Nonetheless, as shown in FIG. 3, using the input sections 340-348, they read a high-level signal on the column lines 310-318 corresponding to the high-level signals applied by the output sections 330-338.

In the row drivers 360-368, the output sections 370-378 are set to apply a passive, low-level signal to the row lines 350-358. By applying a passive low-level signal to the row lines 350-358 while an active high-level signal is applied to the column lines 310-318, the short-circuit resulting from the pressing of one or more of the keys 302 is partially resisted. The pull-down resistor between the low-level source applied to the row lines 350-358 impedes the flow of current from the high-level signal source to the low-level signal source, which results in reduced power loss as compared to a short-circuit caused by coupling two active but opposite signals. The input sections 380-388 of the row drivers 360-368 read that each of the row lines 350-358 presents a low-level signal, reflecting that passive low-level signals are applied by the output sections 370-378 of the row drivers 360-368 to each of the row lines 350-358.

Figure 4:
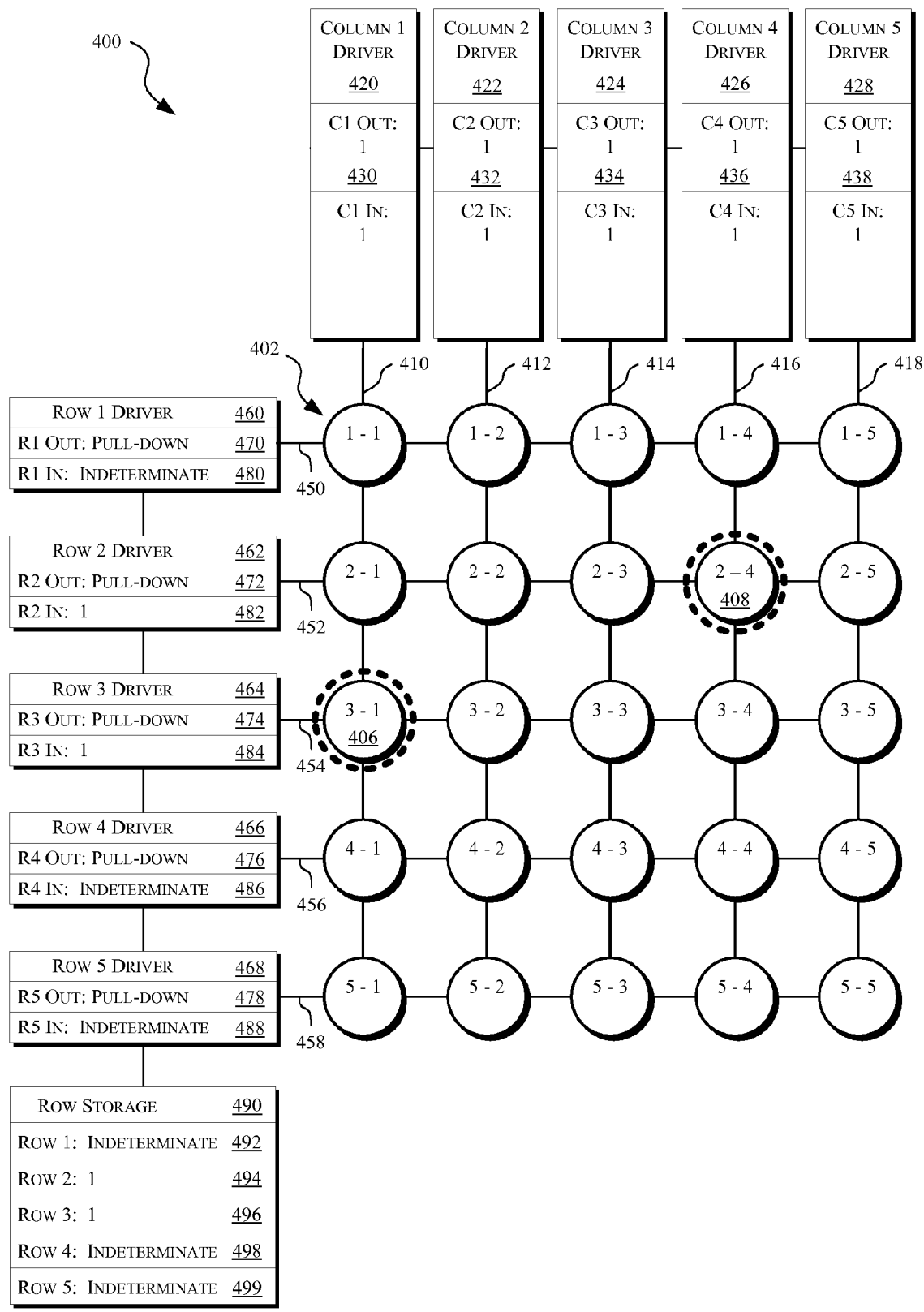

FIG. 4 shows a keyboard system 400 in a situation arising at the moment when two of the keys 402, including key 3-1 406 and key 2-4 408, have been pressed. The pressing of keys 3-1 406 and 2-4 408 is indicated by the dashed line encircling the keys 404 and 408. When multiple keys are pressed, some conventional systems may have difficulty in accurately identifying which keys were pressed, and the pressing of multiple keys may result in an appreciable power drain as a result of the closed circuits.

In the keyboard system 400 shown in FIG. 4, the output sections 430-438 of column drivers 420-428 continue to apply an active high-level signal to the column lines 410-318. The pressing of key 2-4 408 and key 3-1 406 causes the active high-level signals carried by column line 1 410 and column line 4 416 to be electrically coupled to row line 3 454 and row line 2 452, respectively. As a result, the row 2 input 482 of the row 2 driver 462 and the row 3 input 484 of the row 3 driver 464 now detect voltage levels different than the levels applied by the row 2 output 472 of row 2 driver 462 and the row 3 output 474 of row 3 driver 466. The row 1 input 480, the row 4 input 486, and the row 5 input 488, by contrast, continue to read the same signals applied by the row 1 output 470, the row 4 output 476, and the row 5 output 478, respectively. In one implementation, the reading of different signals on the row lines 450-458, or a change in the signal read on any of the row lines 450-458, initiates the keyboard scan. However, the signals read on the row lines 450-458 at the instant following the pressing of one or more keys may not accurately indicate on which of the row lines 450-458 keys have been pressed.

Ideally, the signals detected on the other row lines by the row 1 input 480 of the row 1 driver 460, the row 4 input 486 of the row 4 driver 466, and the row 5 input 488 of the row 5 driver 468 would not change because no keys have been pressed in those rows. However, partially owing to the relatively slow response resulting from the use of pull-down resistors on the row lines 450-458, signal crosstalk between the row lines 450-458 may result from the pressing of key 2-4 408 and key 3-1 406. The signal changes taking place on row line 2 452 and row line 3 454, which are coupled to a low-level signal source through a pull-down resistor by the row 2 output 472 and the row 3 output 474, respectively, may result in the row 1 input 480, the row 4 input 486, and the row 5 input 488, presenting an indeterminate signal. It would not be desirable to record in the row storage 490 the signal values read by the row inputs 480-488 associated with each of the row lines 450-458. The row 2 input 482 and the row 3 input 484 would accurately read a high-level signal indicating that a key has been pressed, and accurate signals could be recorded in the row 2 register 494 and the row 3 register 496. However, as shown in FIG. 4, the row 1 register 492, the row 4 register 498, and the row 5 register 499 would store results that would be indeterminate or inaccurate.

Over time, the signals read on the row lines 450-458 by the row inputs 480-488 would stabilize, with the row 2 input 482 and the row 3 input 484 each reading a high-level signal while the row 1 input 480, the row 4 input 486, and the row 5 input 488, would read a low-level signal. After a sufficient time passes, the signal crosstalk would be discharged by the pull-down resistors coupled with the row lines 450-458. However, because power is being consumed by the keyboard scan and drained between the high-level source and the low-level source, and because a fast keyboard response is desired, it is not desirable to wait for the signals on the row lines 450-458 to stabilize. It could take milliseconds or longer for the signal crosstalk to clear; however, if the signal crosstalk could be quickly discharged, an entire keyboard scan could be completed in less time than it would take for the signal crosstalk to discharge.

Figure 5:
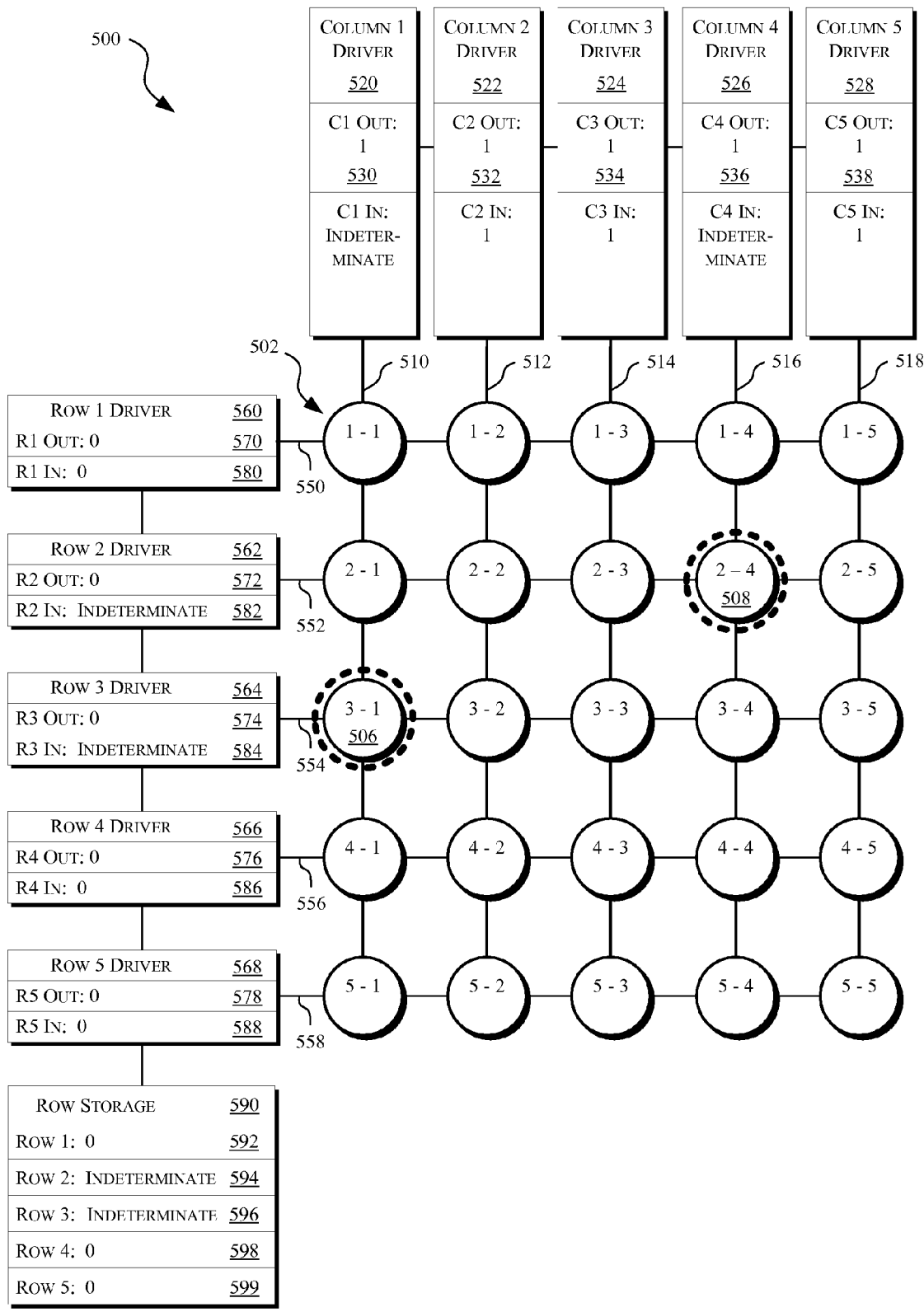

FIG. 5 shows a keyboard system 500 which, in response to the pressing of key 3-1 506 and key 2-4 508, an implementation of the keyboard scan creates a brief short-circuit to rapidly clear potential signal crosstalk among the column lines 510-518 and the row lines 550-558. In one implementation, signal crosstalk is cleared by applying opposing active signals to the row lines and column lines to discharge any secondary voltages resulting from crosstalk between the signal lines. Eliminating the signal crosstalk ensures that the keyboard system 500 will not falsely signal the pressing of any of the keys 502.

In an implementation shown in FIG. 5, signal crosstalk is cleared by applying an active low-level signal to the row lines 550-558 through the output sections 570-578 of the row drivers 560-568, while maintaining the active high-level signal applied by the output sections 530-538 of the column drivers 520-528 to the column lines 510-518. The application of opposing, active signals on the column lines 510-518 and the row lines 550-558 creates a short-circuit between column line 4 516 and row line 2 552 as a result of the pressing of key 2-4 508 and another short-circuit between column line 1 510 and row line 3 554 as a result of the pressing of key 3-1 506. The short-circuit created by applying the active low-level signal to the output sections 570-578 of the row drivers 560-568 discharges any signal crosstalk. The output sections 570-578 of the row drivers 560-568 need only apply the active low-level signal to the row lines 550-558 for a very brief interval to prevent the short-circuit from unnecessarily consuming power.

For example, depending on the devices used, an interval on the order of 50 to 200 nanoseconds may be a suitable duration for the short-circuit to be applied. Such durations are sufficient to clear the signal crosstalk and thus eliminate signals that could falsely indicate the pressing of a key, while being sufficiently brief as not to consume an appreciable amount of power. Moreover, such durations practically are readily implementable using various hardware implementations.

In one implementation, the application of the short-circuit to clear the signal crosstalk is accomplished by a controller instruction that causes the active high-level and active low-level signals to be applied to the respective lines. A C code instruction may be used for this purpose on microcontrollers recognizing the C code instruction or a similar instruction operable to write a signal value to the lines. A next instruction is used to release the short-circuit. Thus, in one implementation the short-circuit is applied for the interval between two controller instructions. Specifically, for example, if the microcontroller operates at a core frequency of 10 MHz, and one instruction uses five clock cycles, then the duration of the short-circuit would last 50 nanosecond. If the core frequency is less than 10 MHz and/or the instruction requires more cycles to complete, the duration may last longer than 50 MHz. In sum, to clear the signal cross-talk, the duration of the short-circuit may be brief, but the duration for which the short-circuit is applied ultimately depends on the hardware implementation used.

The current drain resulting from applying the short-circuit to clear the signal crosstalk also may vary with the duration of the short-circuit interval, the number of keys pressed, and the current applied by the driver circuitry employed. In one implementation, the current demand for clearing the signal cross-talk when a signal key is pressed is only 50 microamps. For each additional key are pressed that results in additional short-circuits between other lines, the current demand increases. However, considering the relatively brief short-circuit duration for which the current will be expended, drains on the level of tens or even hundreds of microamps is more than tolerable, if not negligible. In any case, the exact current drain will vary with short-circuit duration and other implementation details. Nonetheless, implementations of the present disclosure eliminate signal cross-talk with acceptably small levels of current drain As shown in FIG. 5, the short-circuit clears the signal crosstalk. The row outputs 570-578 of the row drivers 560-568 couple the row lines 550-558 directly to a low-level signal source. As a result, row line 1 550, row line 4 556, and row line 5 558 will present a low-level signal because these row lines are not coupled by keys to any of column lines presenting the high-level signal. The signal crosstalk is rapidly discharged and cleared. Thus, the row 1 input 580, the row 4 input 586, and the row 5 input 588 will read a low-level signal (represented as a "0"). On the other hand, because row line 2 552 and row line 3 554 short-circuit a high-level signal presented by column line 1 510 and column line 4 516 by the pressing of key 3-1 506 and key 2-4 508, respectively, to a low level signal presented by the row 2 output 572 and the row 3 output 574, the row 2 input 582 and row 3 input 584 now will read an indeterminate signal. (The column 1 input 540 of the column 1 driver 520 and the column 4 input 546 of the column 4 driver 526 would also read indeterminate signal values as a result of the short-circuit.)

Although the signal crosstalk is cleared, however, the current signal levels should not be recorded to the row storage 590. Although accurate low-level signal values could be recorded to the row 1 register 592, the row 4 register 598, and the row 5 register 599, the values for the row 2 register 594 and the row 3 register 596 would be indeterminate.

Figure 6:
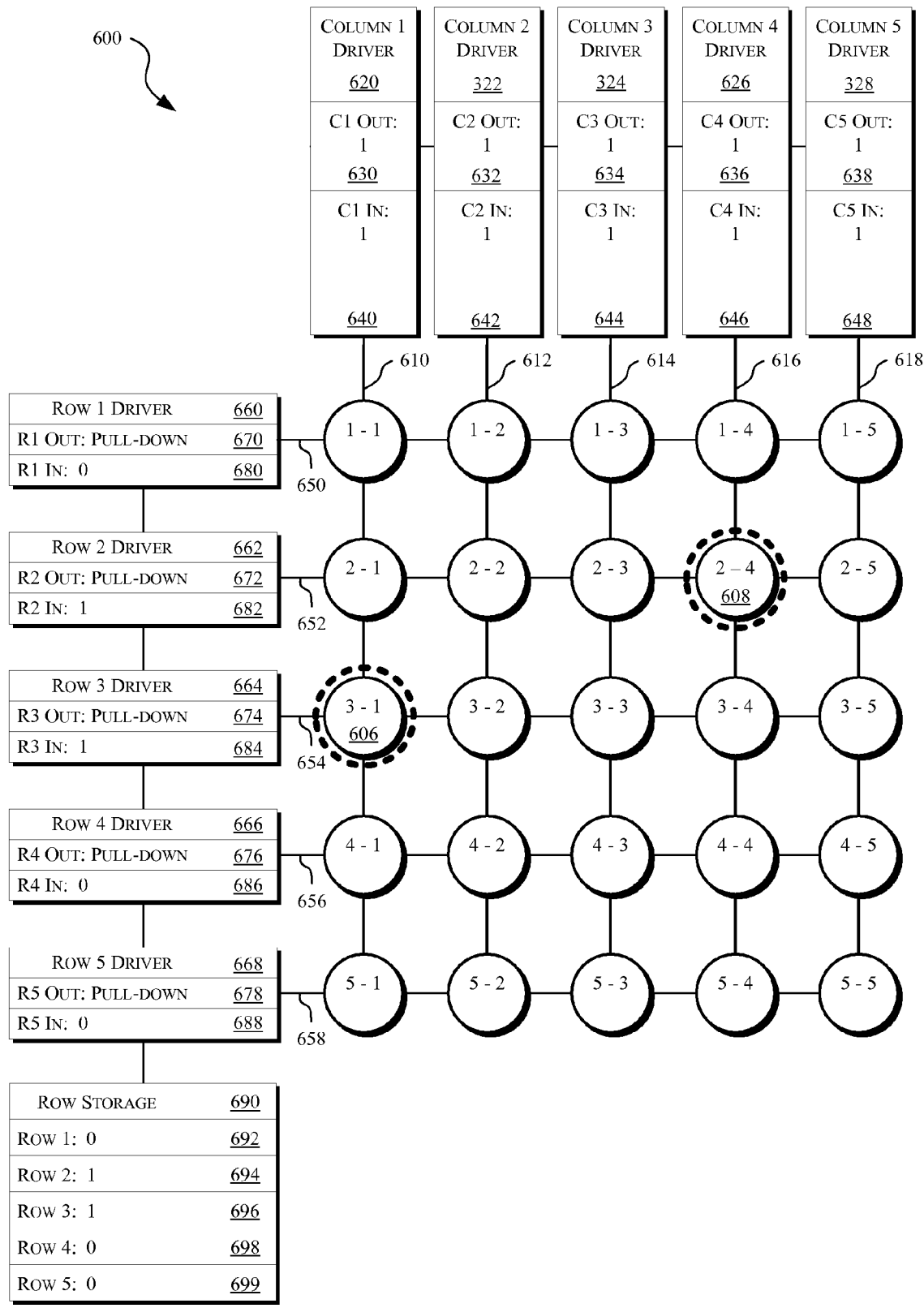

FIG. 6 illustrates a keyboard system 600 in which, after the cross-talk is cleared as described with reference to FIG. 5, the row outputs 670-678 of the row drivers 660-668 are restored to their passive low-level or pull-down levels. The row 1 input 680, the row 4 input 686, and the row 5 input 688 will continue to accurately read a low-level signal. These values are then written in the row 1 register 692, the row 4 register 698, and the row 5 register 699 of the row storage 690. However, the row 2 input 672 and the row 3 input 674 will now both accurately read a high-level signal applied by the column 1 output 630 of the column 1 driver 620 and the column 4 output 636 of the column 4 driver 646 by the pressing of key 3-1 606 and key 2-4 608, respectively.

The column outputs 630-638 of the column drivers 620-628 continue to apply a high-level signal to the column lines 610-618. The column 2 input 642, the column 3 input 644, and the column 5 input 648 continue to read high-level signals on column line 2 612, column line 3 614, and column line 5 618, respectively. After the short-circuit described with reference to FIG. 5 has been removed, the signal on column line 1 610 and column line 4 616 stabilize. Thus, the column 1 input 640 and column 4 input 646 read the high-level signal presented by the column 1 output 630 and the column 4 output 636, respectively. In one implementation, the signals applied by the column output sections 630-638 do not change during this process, so no power is lost in switching the column output sections 630-638.

With the signal levels stabilized, accurate row level signals now can be recorded in the row storage 690. The row 1 register 692, the row 4 register 698, and the row 5 register 699 store low-level signals to indicate that no keys were detected as pressed in these rows. However, the row 2 register 694 and the row 3 register 696 store high-level signals to indicate that keys were detected as pressed in these rows. As explained below, the rows in which a key press has been detected and recorded in the row storage 690 will be scanned individually to determine in what column or columns one or more keys have been pressed. Because no change in signal was recorded for the remaining rows, those rows need not be scanned, thereby saving time and power.

Figure 7:
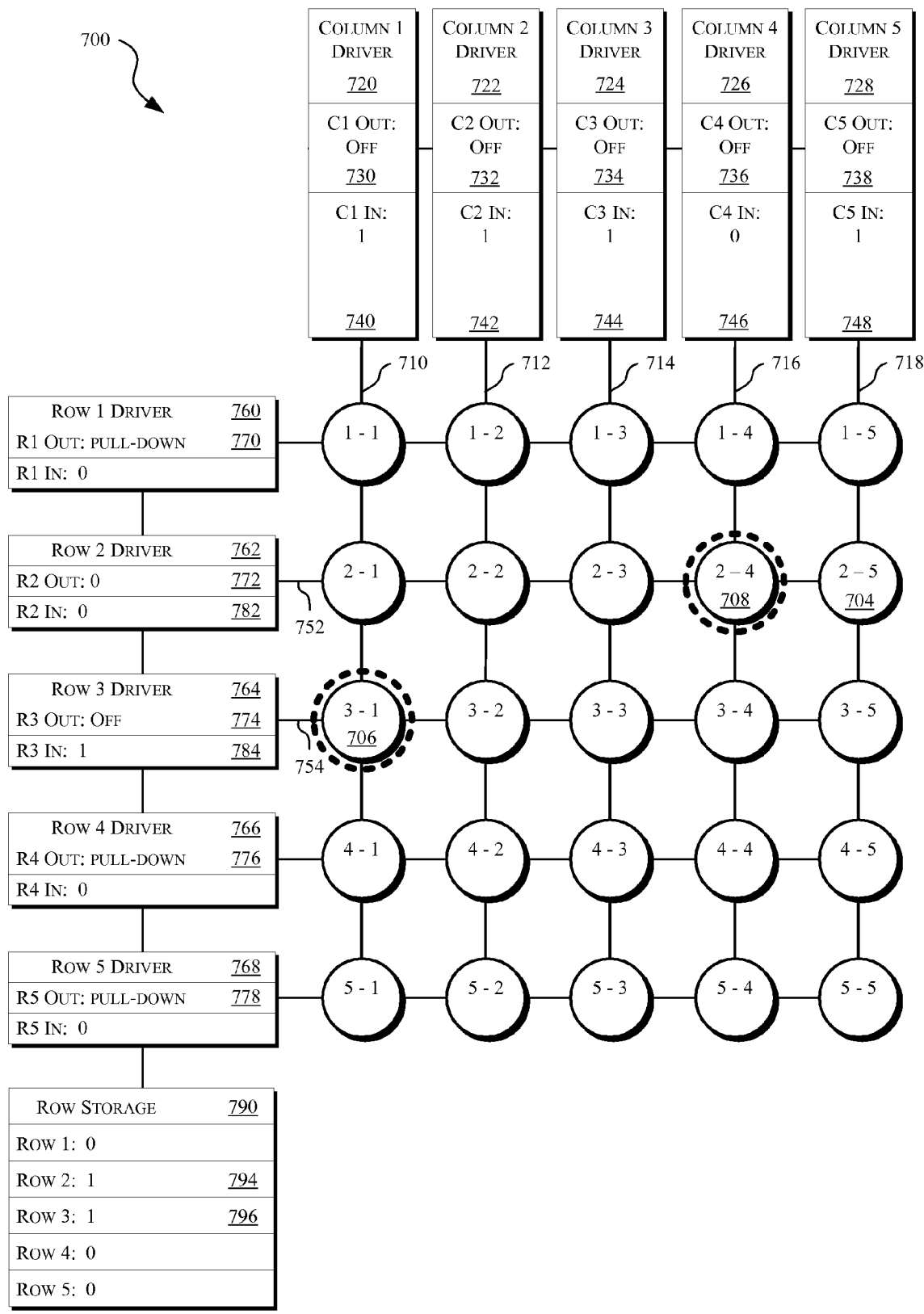

FIG. 7 shows a keyboard system 700 in which one of the rows registering a key press is individually scanned to identify in what column a key or keys 702 were pressed. Again, the row lines to be scanned include row line 2 752 and row line 3 754 on which key presses were detected and logged in row register 2 794 and row register 3 796, respectively, of the row storage 790. In scanning row line 2 752, the row 2 output 772 is set to an active low-level signal. For any other row lines for which the row storage 790 shows that a key was pressed, which in this case is row line 3 754, those row lines are decoupled from a signal source, as indicated by the row 3 output 774 reading as "OFF." Causing row line 3 754 to be decoupled from a signal source will avoid the scan of row line 2 752 from mistakenly indicating that a key has been pressed in a column in row line 2 752 when, actually, a key might have been pressed in that column in another row. In other words, row line 3 754 is decoupled to ensure that the scan of row line 2 752 does not indicate that a key has been pressed in row line 2 752 at column line 1 710, when it was the pressing of key 3-1 708 in row line 3 754 that will cause a signal to be read in column line 1 710 in the process further described below. Isolating other row lines in which key presses were detected while individually scanning each of the row lines in which key presses were detected avoids mistakenly identifying that keys pressed in other row lines were pressed in the row line currently being scanned.

The row 3 input 784 continues to read a high-level signal. Row line 3 754 continues to be coupled to column line 1 710 by key 3-1 706, and column line 1 710 carries a high-level signal applied by column 1 output 730. Row lines on which no key press was detected are returned to their initial pull-down states, as indicated by the row 1 output 770 of the row 1 driver 760, the row 4 output 776 of the row 4 driver 766, and the row 5 output 778 of the row 5 driver 768 all reading as "PULL-DOWN."

While individually scanning row lines in which a key press previously was detected, the output sections 730-738 of the column drivers 720-728 are decoupled from a signal source. Because a high-level signal was previously applied to the column lines 710-718, the signal in the column lines 710-714 and 718 that are not coupled to a row line by the pressing of a key or are coupled to a decoupled row line, such as row line 3 754, will not change. Thus, the column 1 input 740, the column 2 input 742, the column 3 input 744, and the column 5 input 748 will still show a high-level signal.

However, because the row 2 output 772 applies an active low-level signal to column line 4 716 through the pressed key 2-4 708, the column 4 input 746 will read a low-level signal on column line 4 716. Because the different signal was applied to row line 2 752 and it was detected on column line 4 716, it can be determined that key 2-4 708 has been pressed. In sum, what key or keys have been pressed is determined by applying a different signal to a row line on which a key press was previously detected and scanning the column lines to determine on which of them a different signal is now detected.

Although not shown in the example of the drawings, one should note that the keyboard scan herein disclosed would identify when keys in more than one column are pressed in each row. Hypothetically, if key 2-5 704, which is in row line 2 752 and column line 5 718, also were pressed, the column 5 input 748 would also read a low-level signal like the column 4 input 746 read as shown in FIG. 7. Thus, the keyboard scan will identify when multiple keys have been pressed in each row, subject to key masking conditions as described with reference to FIGS. 10-15.

If a key press was detected only in a single row, the keyboard scan would now be complete. The keyboard system would then be reset to an initial condition as depicted by the keyboard system 200 or FIG. 2. The pressing of a key would then generate an interrupt that would reinitiate the keyboard scanning process. However, if the row storage 790 (or whatever other device or process is used to track in which row lines a key press was detected) shows that a key press was detected in another row line, the keyboard scan continues until each of the row lines is scanned.

Figure 8:
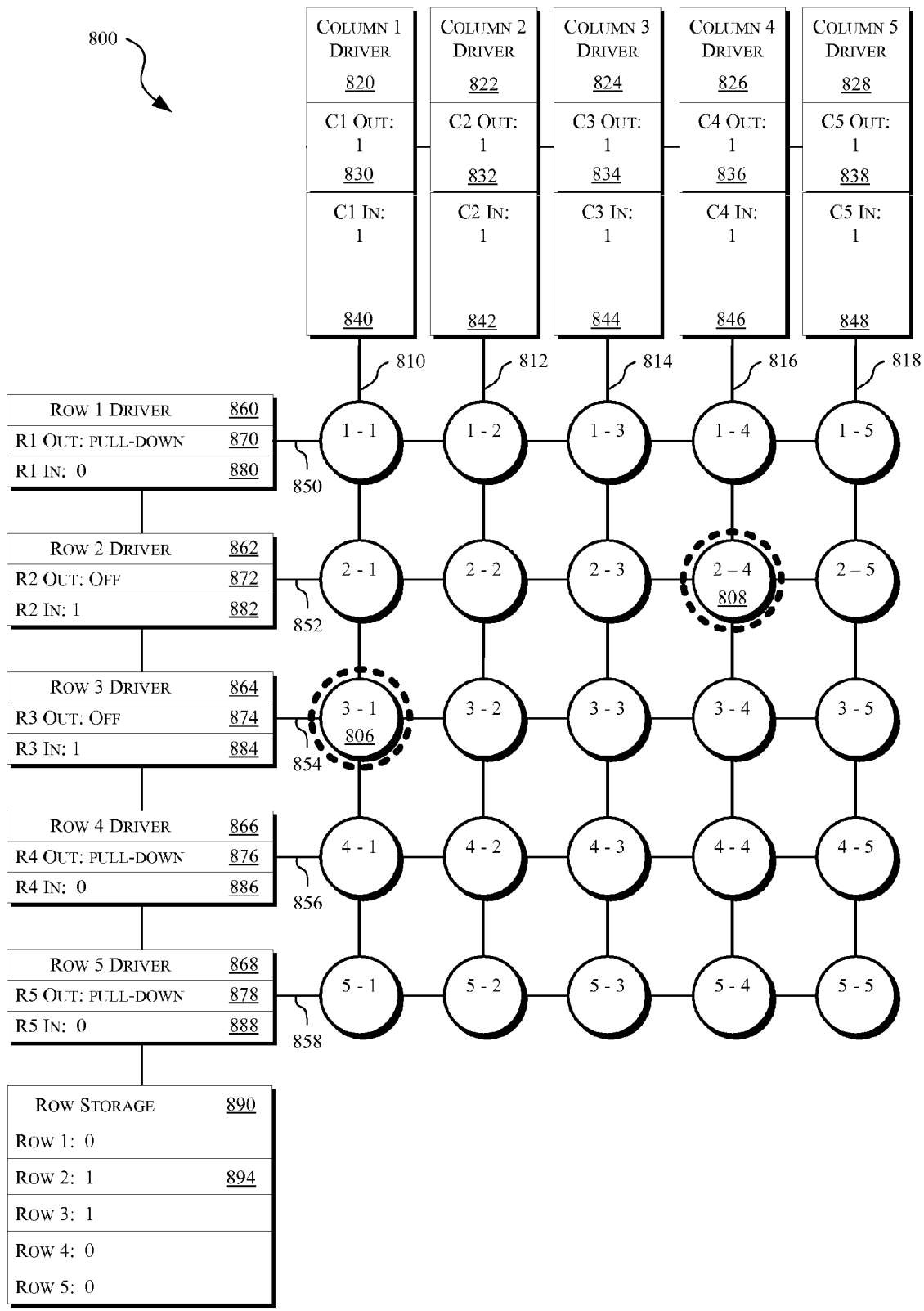

FIG. 8 shows the keyboard system 800 being reset between the scans of each row line on which a key press was previously detected. The column output sections 830-838 of the column drivers 820-828 apply an active high-level signal to the column lines 810-818 to refresh the high-level signal on each of the column lines 810-818 for the next row line scan. Thus, column input sections 840-848 all will read a high-level signal prior to the scanning of the next row line in which a key press was detected.

The last scanned row, in this case row line 2 852, is decoupled from a signal source by the row 2 output 872 of the row 2 driver 862. As previously described, row lines on which a key press have been detected but that is not currently being scanned are decoupled to avoid reading keys pressed in columns of other rows. The row 2 input 882 indicates that decoupling row line 2 852 results in row line 2 852 presenting a high-level signal as a result of being connected to the high-level signal applied to column line 4 816 by the column 4 output 836 by the pressing of key 2-4 808.

The row lines on which no key press was previously detected, including row line 1 850, row line 4 856, and row line 5 858 remain pulled down to a passive low-level signal to avoid creating spurious signals by the row 1 output 870 of the first row driver 860, the row 4 output 876 of the row 4 driver 856, and the row 5 output of the row 5 driver 858. This is indicated illustrated by the low-level signals read by the row 1 input 880, the row 4 input 886, and the row 5 input 868.

Row line 3 854 is about to be scanned, as described below with reference to FIG. 9. Between row line scans, there is no need to pull down row line 3 854. Doing so would only unnecessarily consume power by the pressing of a key coupling an active high-level signal from a column line to a low-level source, even if only through a pull-down resistor. Thus, row line 3 854 remains decoupled, as reflected by the row 3 output 874 of the row 3 driver 864 continuing to read as "OFF." Because row line 3 854 is coupled to column line 1 810 by the pressing of key 3-1 808, the row 3 input 884 reads a high-level signal as applied to column line 1 810 by the column 1 output 840

In addition, although not shown in FIG. 8, now that row line 2 872 has been scanned, in the row storage 890, the row 2 register 894 may be reset to binary 0 or other signal to indicate that row line 2 852 already has been scanned. However, the row 2 register 894 need not be reset until all the row lines have been scanned, provided some technique is used to avoid scanning a row line that already has been scanned.

Figure 9:
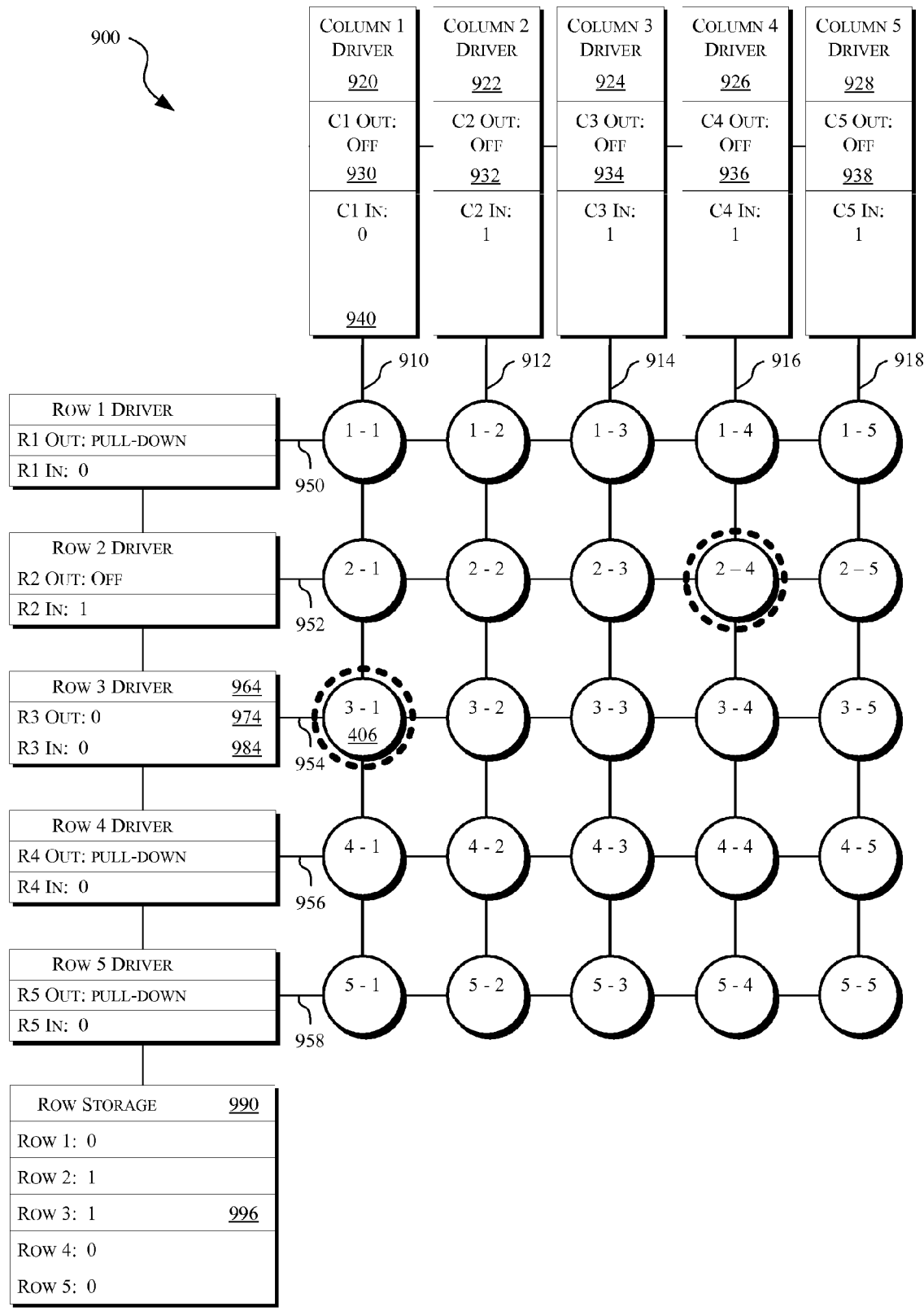

FIG. 9 shows the keyboard system 900 as set for scanning the next row line, row line 3 954, on which a key press was previously detected. The pressing of a key in row line 3 954 previously was stored in the row 3 register 996 of the row storage 990. As previously described with reference to FIG. 7, each of the column outputs 930-938 of the column drivers 940-948 are again decoupled so as to apply no signal to the column lines 910-818. However, after the reset described with reference to FIG. 8, the column lines 910-918 will present a residual high-level signal unless discharged through a connection with one of the row lines. Row line 1 950, row line 4 956, and row line 958 remain pulled down to present a passive low-level signal. Row line 2 952 remains decoupled. However, the row 3 output 974 of the row 3 driver 964 now applies an active low-level signal to row line 3 954 as reflected by the row 3 input 984 reading a low-level signal.

Because row 3 output 974 applies an active low-level signal to column line 1 910 through the pressed key 3-1 906, column 1 input 940 will read a low-level signal on column line 1 910. Because a signal different than that applied to the other row lines was applied to row line 3 952 and it was detected on column line 1 910, it can be determined that key 3-1 906 has been pressed.

The process of scanning each of the individual row lines is repeated for as many row lines for which a key press previously was detected, which, in one implementation, is tracked by the row storage 990. In the foregoing example, once row line 2 952 and row line 3 954 are scanned, and it has been determined in what columns keys have been pressed in each of those rows, it can be determined which keys were pressed. The key or keys that have been pressed are reported to the system using the keyboard. The keyboard system is reset to await detection of a next key press.

In the foregoing example, it is the row lines that are monitored for key presses and then scanned to identify which keys have been pressed. However, one should note that a keyboard scan could monitor and individually scan the columns instead of the row lines. Furthermore, the keyboard scan described could be used with keyboard systems in which the keys are not aligned in a conventional array of rows and columns. Instead, the keyboard system could include another form of keyboard including overlapping sets of signal lines. Also, it should be noted that the signal levels used for monitoring or scanning the lines could be reversed, using high-level signals instead of low-level signals and vice versa. The keyboard scan herein disclosed identifies differences in signals caused by the pressing of keys as opposed to identifying particular signal levels, whether those signal levels are high or low.

Implementations of the keyboard scan provide a number of benefits. First, using the keyboard scan, there are no uncontrolled short-circuits between any of the lines, thereby avoiding wasted power. In addition, the keyboard scan can be executed very quickly because only lines on which key presses are detected are scanned instead of scanning the entire keyboard. Also, the keyboard scan uses few signal changes. The column output sections continually hold a high voltage level and the row output sections need not be activated until a scan starts. Because of the low power consumption, the keyboard scan can be implemented for wireless keyboard applications, for example, using Bluetooth technology.

Detection of Key Masking During a Keyboard Scan

Figure 10:
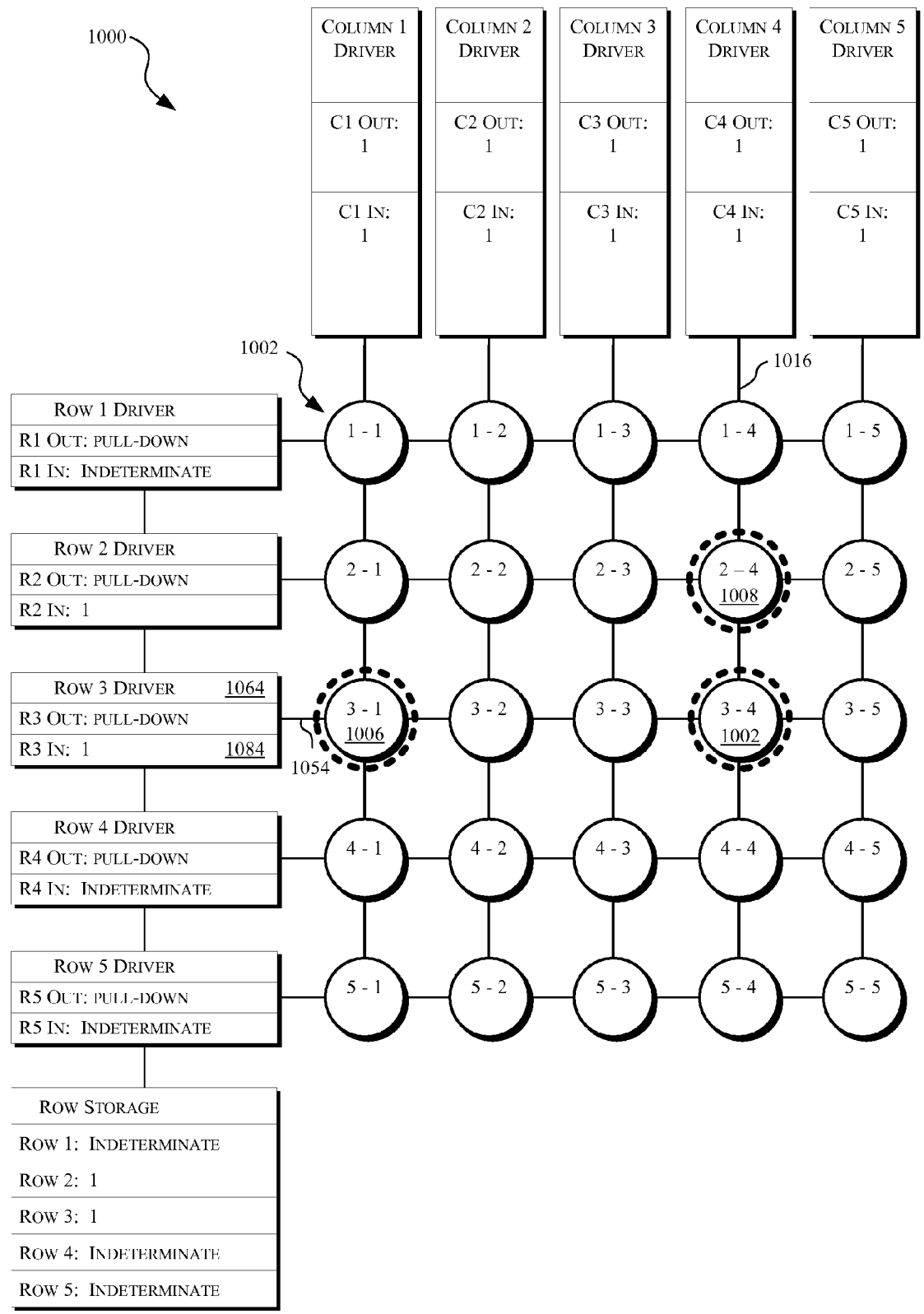
FIGS. 10-15 are block diagrams of a keyboard system depicting operation of an implementation of a keyboard scan adapted for identifying key masking situations.

Implementations of the keyboard scan are operable to detect when the pressing of some keys is masked, which could lead to an inaccurate result. FIG. 10 shows a keyboard system 1000 that is similar to the keyboard system 400 of FIG. 4 except that, in addition to key 3-1 1006 and key 2-4 1008 being pressed on the keyboard 1002, key 3-4 1002 also is pressed. Because key 3-4 1002 lies in the same row as key 3-1 1006, the row 3 input 1084 of the row 3 driver 1064 is the same as when only key 3-4 1002 is pressed because the pressing of key 3-1 1006 already has resulted in a connection between column line 3 1016 and row line 3 1054.

Figure 11:
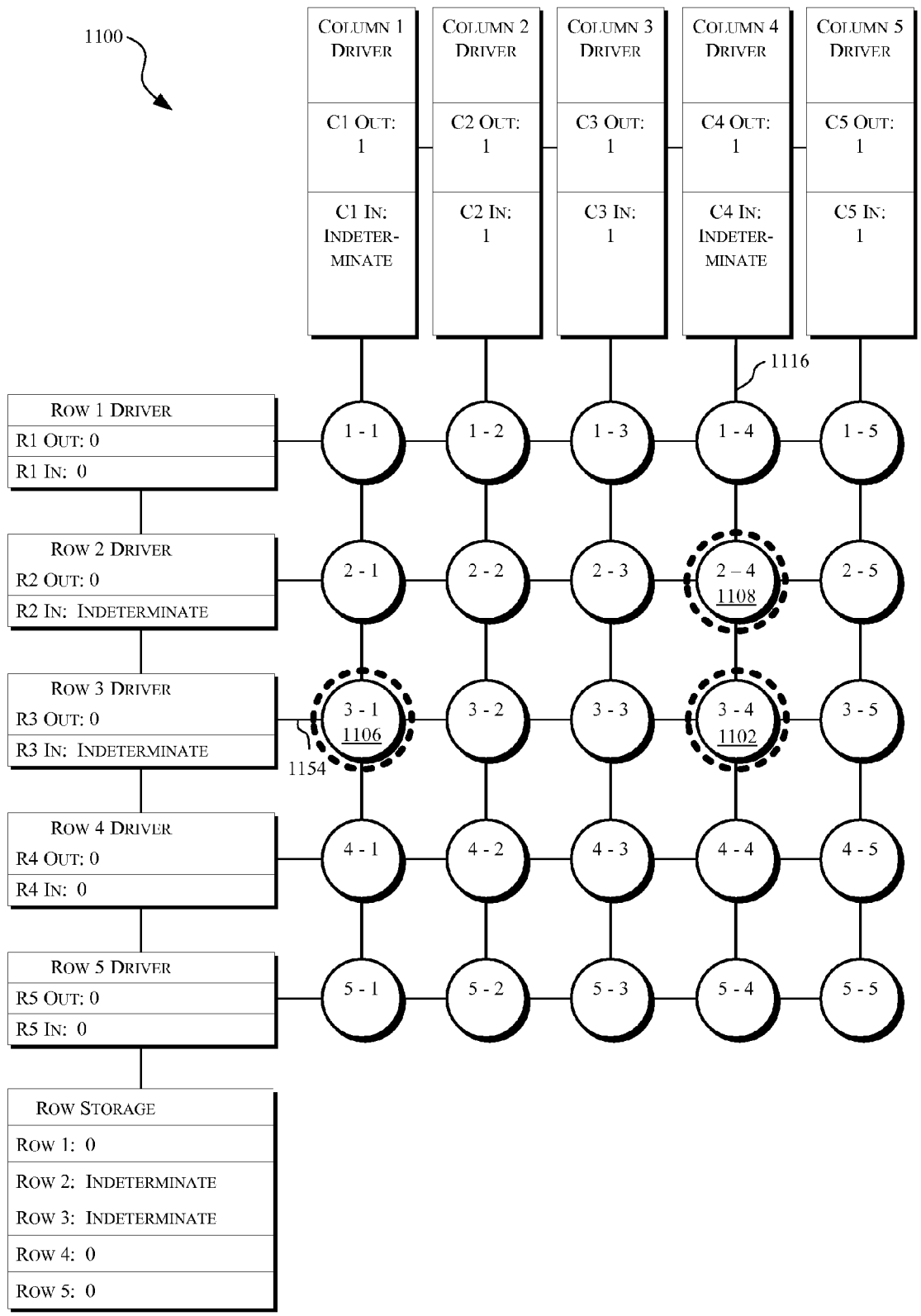

FIG. 11 shows a keyboard system 1100 in which signal crosstalk is cleared as previously described with reference to FIG. 5. In fact, FIG. 11 is identical to FIG. 5 except for the fact that key 3-4 1002 is pressed. However, key 3-4 1102 is in row line 3 1154 and column line 3 1116, each of which already was short-circuited as the result of key 3-1 1106 and key 2-4 1108 being pressed, the pressing of key 3-4 1102 has no or minimal effect on the signal cross-talk short-circuiting.

Figure 12:
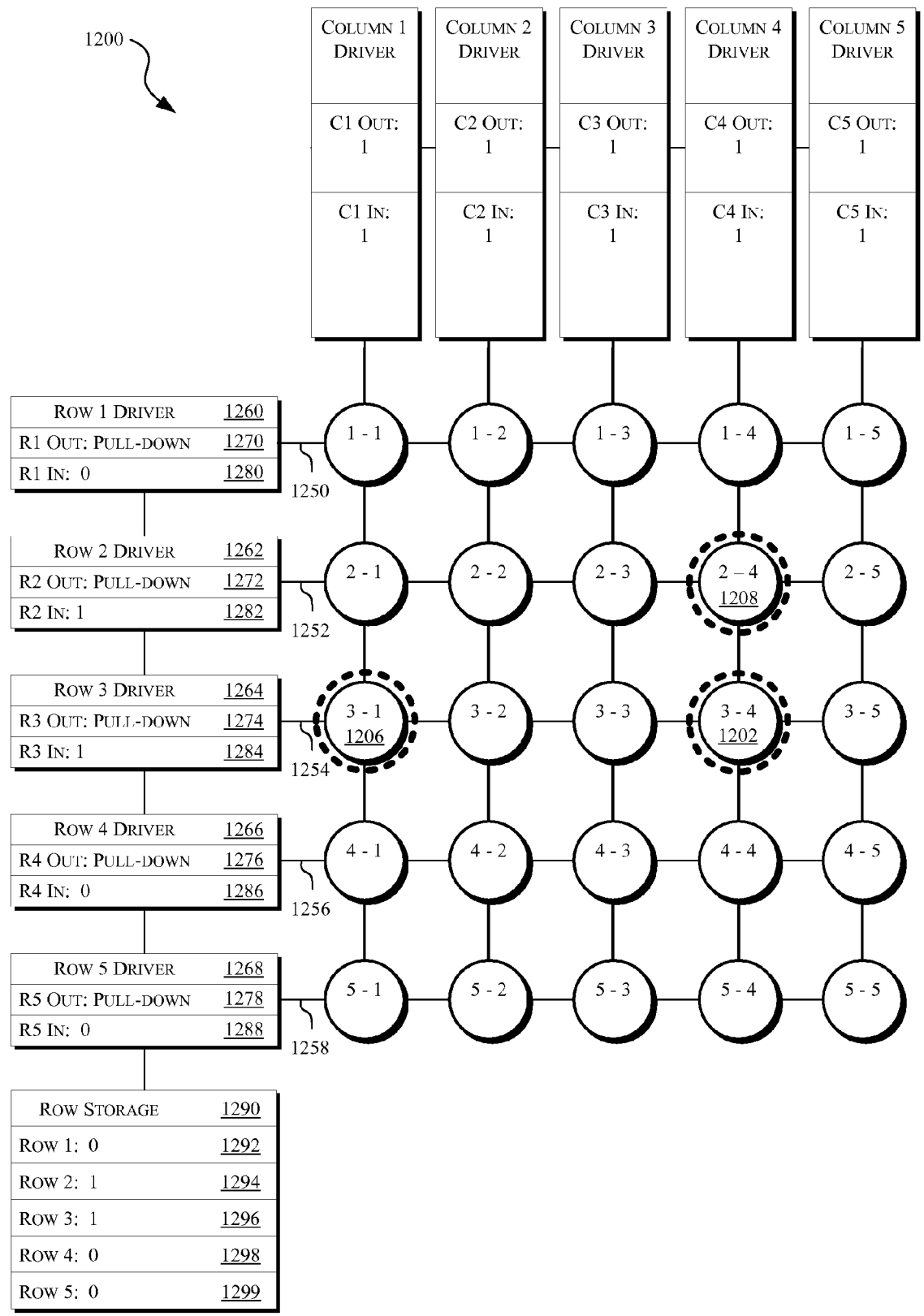

FIG. 12 shows a keyboard system 1200 representing the reading of the keys being pressed after the signal crosstalk is cleared as described with reference to FIG. 11. FIG. 12 is identical to FIG. 6 except for the fact that key 3-4 1202 is pressed. As a result of the limited, intentional short-circuits used to clear the signal crosstalk and the pressing of key 2-4 1208 and key 3-1 1206, the row 2 input 1282 of the row 2 driver 1262 and the row 3 input 1284 of the row 3 line driver 1264, respectively, both read a high-level signal represented by a "1." In row line 1 1250, row line 4 1256, and row line 5 1258, no keys have been pressed, thus none of the row inputs 1280, 1286, and 1288 of the other row drivers 1260, 1266, and 1268, respectively, read a high-level signal.

The pressing of key 3-4 1202 does not change what is read by any of the row inputs of the row drivers as compared to the situation illustrated in FIG. 6: key 3-4 1202 is in the same row as key 3-1 1206, and the pressing of key 3-1 1206 already resulted in the row 3 input 1284 reading a high-level signal. Thus, the pressing of key 3-4 1202 is masked in this phase of the keyboard scan. As was the case in the situation of FIG. 6, in the row storage 1290, a high-level value is stored in the row 2 storage register 1294 and the row 3 storage register 1296, while low-level values are stored in the other row registers 1292, 1298, and 1299.

Figure 13:
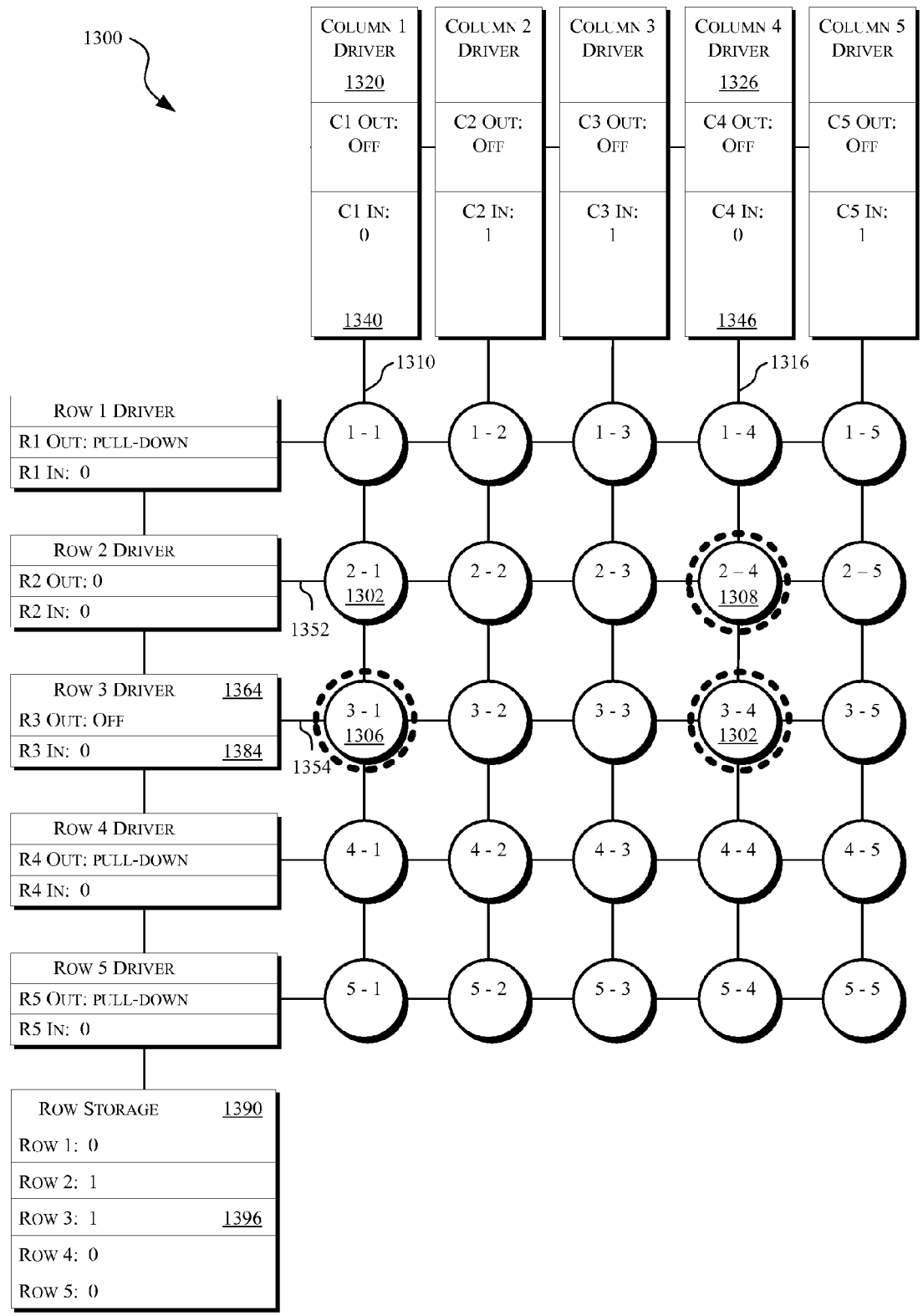

As shown in FIG. 13, however, the pressing of key 3-4 1302 changes the effect of the subsequent scan of row line 2 1352. The keyboard system 1300 of FIG. 13 represents a situation similar to that of FIG. 7 in which a scan signal is applied to row line 2 1352. However, in the example of FIG. 13, but the pressing of key 3-4 1302 in row line 1352 changes what is read on other row lines and column lines. The low-level scan signal applied to row line 2 1352 is coupled with column line 4 1316 by the pressing of key 2-4 1308, once again resulting in the column 4 input 1346 of the column 1 driver 1326 reading a low-level input. However, as shown in FIG. 13, the low-level scan signal coupled to column line 4 1316 is also coupled to row line 3 1354 by the pressing of key 3-4 1302. As a result, the row 3 input 1384 of the row 3 driver 1364 now reads the low-level scan signal. Also, the pressing of key 3-1 1306 couples the low-level scan signal to column line 1 1310, causing the column 1 input 1340 of the column 1 driver 1320 to read the low-level scan signal.

As previously described, implementations of the keyboard scan use the individual row line scans to identify in what column or columns keys have been pressed in each row line. For example, in the row line scan depicted in FIG. 7, when row line 2 752 was scanned and the scan signal was detected on column line 4 716, it was determined that key 2-4 708 had been pressed. However, in FIG. 13, the row scan applied to row 2 1382 results in both the column 4 input 1346 of the column 4 driver 1326 and the column 1 input 1340 of the column 1 driver 1320 reading the low-level scan signal. As a result, attempting to identify which keys have been pressed as a combination of which columns present the scan signal when row line 2 1352 is scanned, it would be determined—incorrectly—that key 2-1 1302 was pressed in addition to key 2-4 1308.

The masking situation can be identified by performing a key masking check. In one implementation, this check evaluates two key masking conditions. First, for each row line scan, it is determined whether more than one column line detects the scan signal during the scan of a single row line. If not, the row line scan detects no key masking, and the keyboard scan continues with the next row line scan. However, as in the situation shown in FIG. 13 in which the scan of row line 2 1352 results in key presses being detected in both column line 1 1310 and column line 4 1316, this first condition would be met.

Second, when a key press is detected in more than one column during a row line scan, the row input for each of the other row lines is checked to determine if the current row input differs from the inputs previously determined. In FIG. 13, the row 3 register 1396 of the row storage 1390 stores a high-level signal that was written to the row storage 1390 as described with reference to FIG. 6. However, as a result of the key masking situation, the row 3 input 1384 now reads a low-level signal. Because the values stored in row 3 input 1384 and the row 3 register 1396 do not agree, the result of the scan is indeterminate. In one implementation of the keyboard scan, an error would be reported to the system using the keyboard scan, seeking new user input and initiating a new keyboard scan.

Using implementations of the keyboard scan, only limited situations will cause such a problematic masking condition. Specifically, such a masking condition results only when at least two keys are pressed in the same row and when one of those keys pressed is in a column in which another key has been pressed, as is the case in FIGS. 10-13. In other words, the key masking situation of FIGS. 10-13 resulted because key 3-4 was in the same column as key 2-4 and in the same row as key 3-1.

Figure 14:
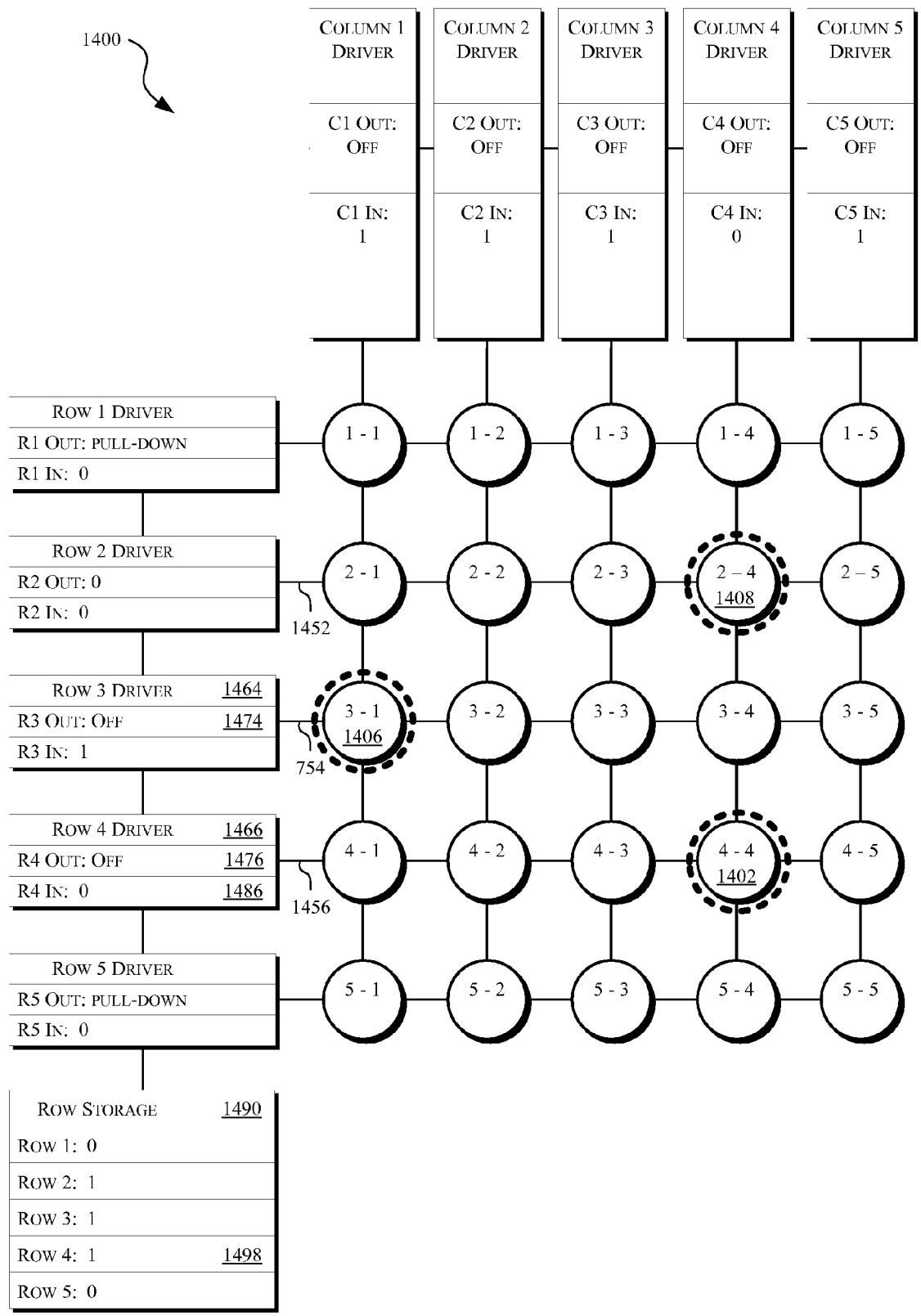

FIG. 14 illustrates a keyboard system 1400 that is similar to the keyboard system 700 of FIG. 7 except that, in the situation of FIG. 14, an additional key is pressed in a same column but in a different row as other keys that have been pressed. However, when that key is in a different row from one or more keys have been pressed, no key masking situation will result.

In FIG. 14, key 4-4 1402 is pressed along with key 2-4 1408 and key 3-1 1406. As a result of key 4-4 1402 being pressed, the row 4 register 1498 in the row storage 1490 will store a high-level signal indicating that a key in row line 1456 has been pressed. When the scan signal is applied to row line 2 1452, the row 3 output 1474 of the row 3 driver 1464 and the row 4 output 1476 of the row 4 driver 1466 will be decoupled from their respective row lines. When the scan signal is applied to row line 2 1452, the pressing of key 4-4 1402 will cause the scan signal to be coupled to row line 4 1456 and read by the row 3 input 1486 of the row driver 1466.

However, because none of the other keys in row line 4 1456 have been pressed, the scan signal will not be coupled to any other column lines, so no false inputs will be read on any of the column inputs. In other words, because only one column line detects a scan signal, the first key masking condition of the scan signal being read in two column lines for the scan of a single row line does not arise. Thus, even though the second masking condition would be met because the row 4 input 1486 would read a signal different from the signal scored in the row 4 register 1498, because the first condition is not met, the second condition would not be tested.

Figure 15:
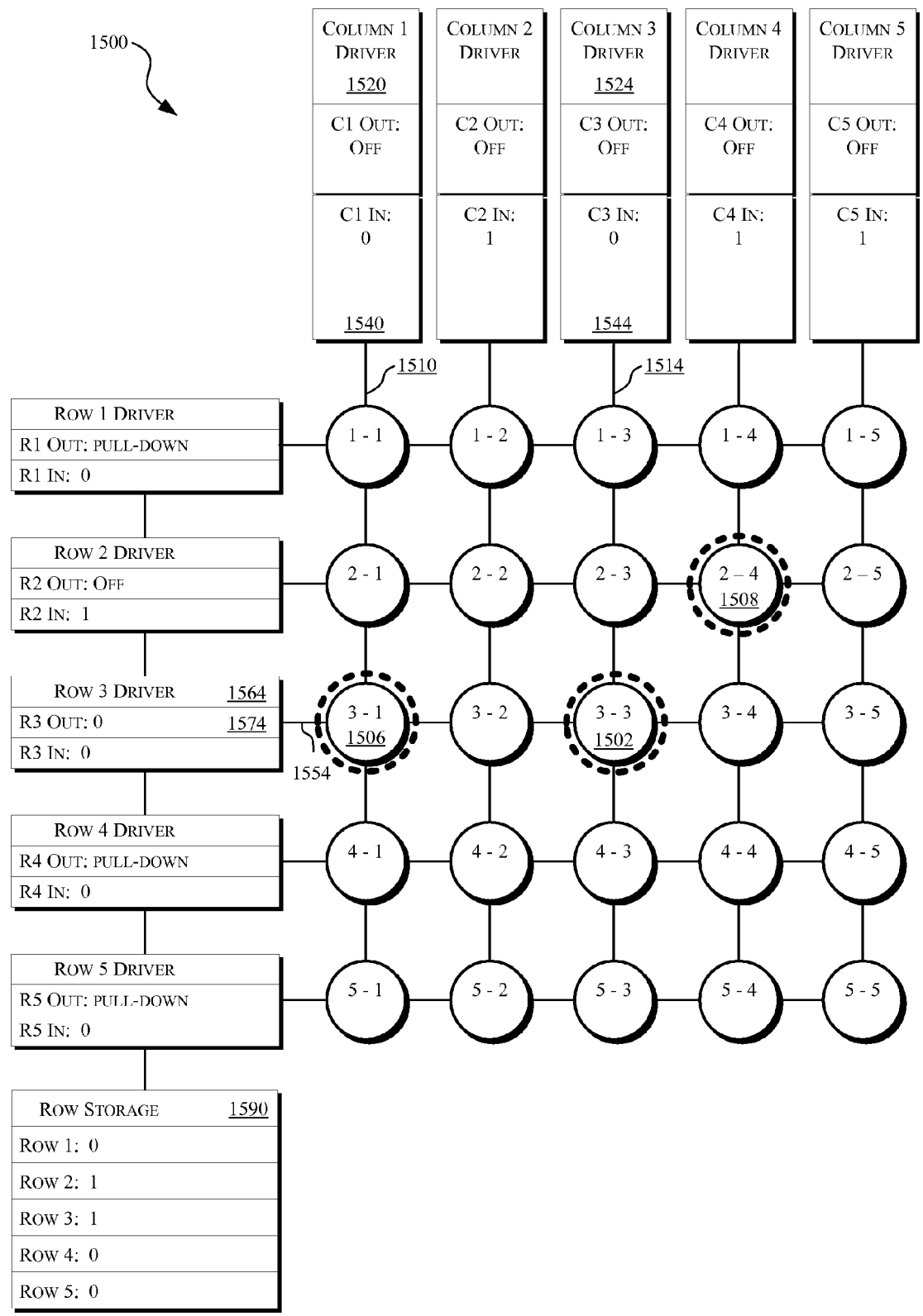

FIG. 15 illustrates a keyboard system 1500 that is similar to the keyboard system 900 of FIG. 9 except that, in the situation of FIG. 15, an additional key is pressed in a same row line but in a different column from other keys that have been pressed. However, when the key pressed is in a column from one or more keys in the same row line that have been pressed, no key masking situation will result.

In FIG. 15, key 3-3 1502 is pressed along with key 2-4 1508 and key 3-1 1506. As a result of key 3-3 1502 being pressed, when row line 3 1554 is scanned, the scan signal applied to row line 3 1554 by the row 3 output of the row 3 driver will be applied to the column 1 line 1510 and the column 3 line 1514. both the column 3 input 1544 in the column 3 driver 1524 and the column 1 input 1540 of the column 1 driver 1520 will read the scan signal applied to row line 3 1554. Because the scan of row line 3 1554 causes the scan signal to be detected in two columns, the first key masking condition is met.

However, the pressing of key 3-3 1502 will not crosscouple the scan signal to any other row lines because no other keys on column line 3 1514 have been pressed. In other words, the pressing of key 3-3 1502 does not change any of the row input values from what is stored in the row storage 1590. Thus, the second masking condition, determining whether any row lines detect different values, will not be met. In sum, only specific combinations of key presses result in a key masking situation that result in the keyboard scan yielding an indeterminate result.

Process for Performing Keyboard Scans

Figure 16:
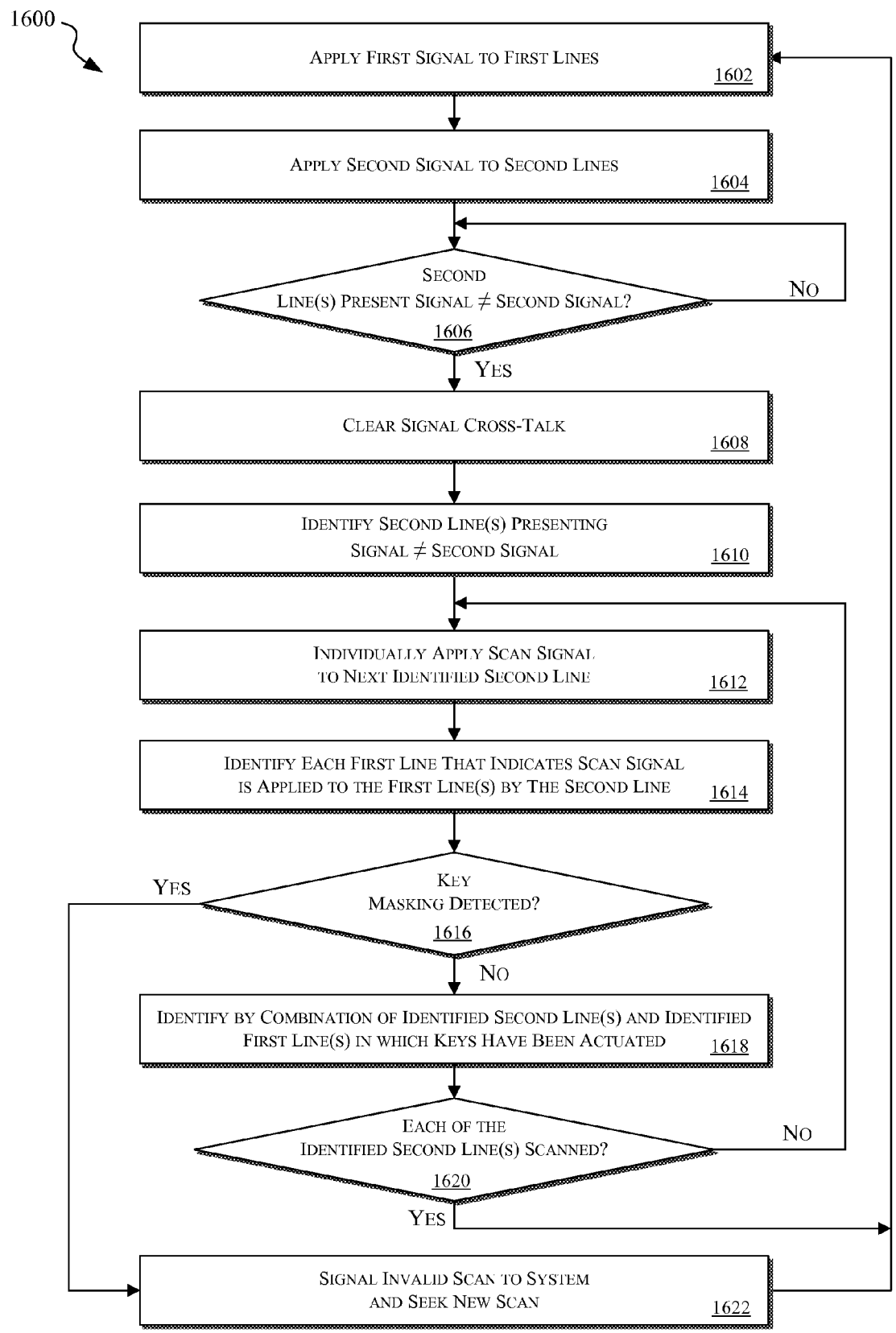
FIG. 16 is a flow diagram of an implementation of a keyboard scan.

FIG. 16 presents a flow diagram 1600 of an implementation of performing a keyboard scan as described in the foregoing examples illustrated in FIGS. 2-15. The flow diagram 1600 illustrates a process of a keyboard scan for a keyboard using a first and second set of signal lines in which the line in the first set is coupled with a line in the second set when a key is pressed. At 1602, a first voltage is applied to a first set of lines, for example, just as a high-level signal was applied to the column lines as described with reference to FIG. 3. At 1604, a second voltage is applied to a second set of lines, for example, just as a passive low-level signal was applied to the row lines as described with reference to FIG. 3. At 1606, it is determined if any of the second lines presents a signal that is not equal to the second signal. As described with reference to FIG. 4, this change in signal may indicate that a key has been pressed. If it is determined at 1606 that none of the second lines registers a signal that is not equal to the second signal originally applied to the second lines, it is assumed that no key has been pressed. The flow diagram 1600 then loops to 1606 to continually determine if a signal change indicates that a key has been pressed.

However, if it is determined at 1606 that one or more of the second lines presents a signal not equal to the second signal, at 1608, signal crosstalk on the lines is cleared through the use of a brief, controlled short-circuit as previously described. At 1610, it is identified which of the second lines presents a signal different from the second signal. For example, with reference to FIG. 6, row line 2 652 and row line 3 654 were identified as presenting a different signal and thus were flagged for scanning in the row storage 690. It is these identified second lines that are individually scanned to determine the first lines with which they are coupled and, thus, what key or keys have been pressed.

At 1612, a scan signal is individually applied to a next identified second line. For example, with reference to FIG. 7, an active low-level signal was individually applied as a scan signal to row line 2 752 while the other identified row line, row line 3 754, was decoupled from a signal source. At 1614, one or more first lines that indicate the scan signal is being applied to them by the identified second line are identified. For example, in FIG. 7, column line 4 716 presented a signal value different from its original high-level value, indicating that the pressing of a key caused the low-level scan signal presented by the identified second row line, row line 2 752, to be applied to column line 4 716. Column line 4 716 was thus recognized as having a key pressed in that column.

At 1616, it is determined if any key masking is detected. As previously described with reference to FIGS. 10-15, key masking may result when a key is pressed in a same row and a same column as other keys that have been pressed. In one implementation, as previously described, key masking can be detected by checking conditions including whether keys have been pressed in more than one column in a same row and if the row input value changes relative to a previously detected value. If key masking is detected at 1616, the flow diagram 1600 advances to 1622 where an invalid scan is signaled to the system using the keyboard scan, and a new keyboard scan will be sought.

At 1618, by combination of the identified second line being scanned and the first line(s) identified, it is determined which key or keys have been pressed or otherwise actuated. For example, with reference to FIG. 7, because row line 2 752 was being scanned and column 716 was identified as active in that it was in contact with the scan signal, it was identified that key 2-4 408 had been pressed. At 1620, it is determined whether each of the identified second lines has been scanned. If not, the flow diagram 1600 loops to 1612 to individually apply a scan signal to the next identified second line. On the other hand, if it is determined at 1620 that each of the identified second lines has been scanned, flow diagram 1600 loops to 1602 where the keyboard system is reset and a first signal is applied to the first lines.

Computing System for Supporting and Making Use of a Keyboard Scan

A keyboard scan may be implemented in software executing on a stationary or mobile computing system that utilizes a keyboard such as keyboard 110 (FIG. 1). For example, the keyboard scan may be manifested in computer readable instructions read from a storage medium and executed on a microprocessor or other processing unit. A general purpose computer operable to support such a software implementation is shown in FIG. 17.

Figure 17:
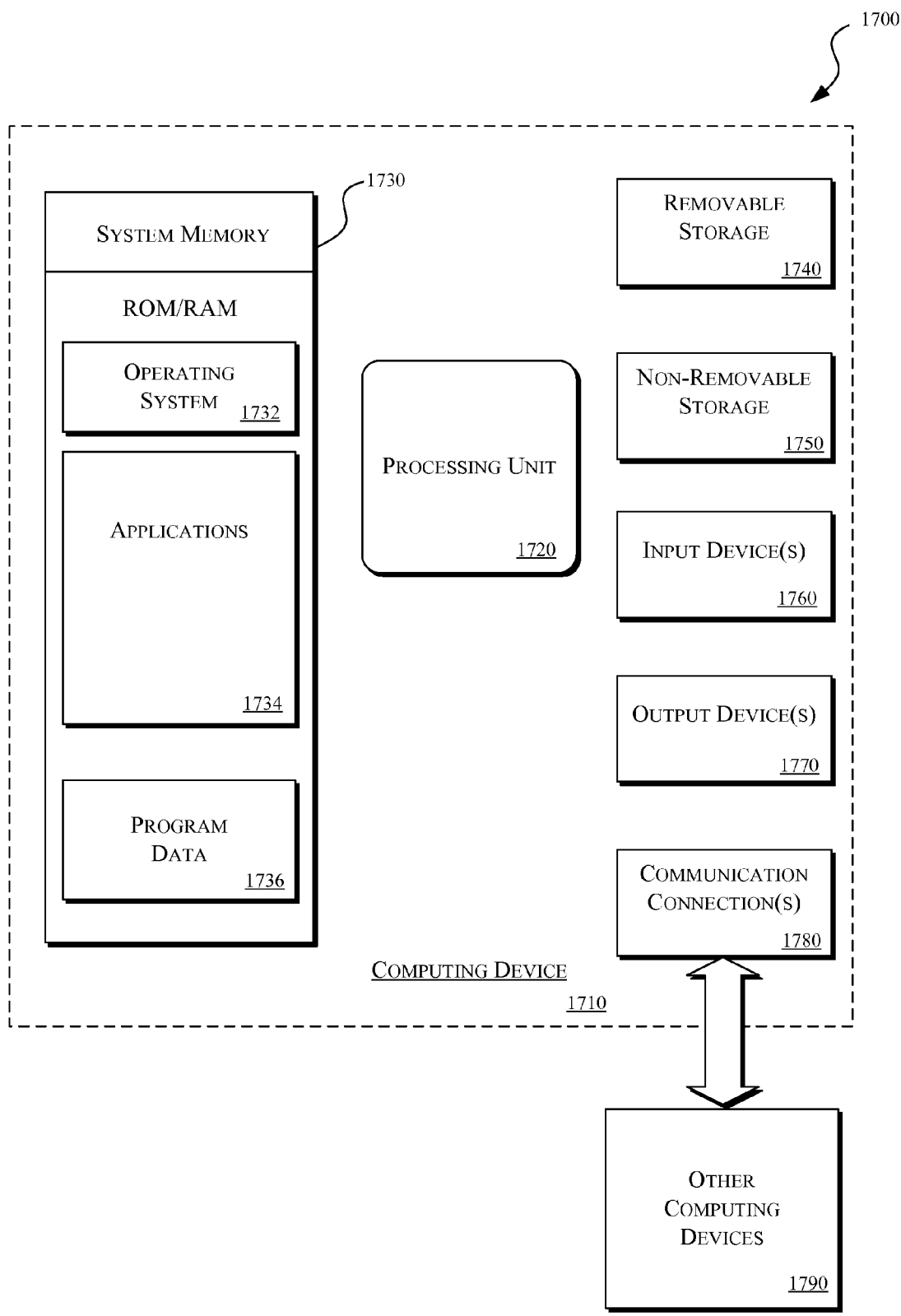
FIG. 17 is a block diagram of a general purpose computing system operable to support and make use of an implementation of a keyboard scan.

Referring to FIG. 17, an exemplary operating environment 1700 includes a computing device, such as computing device 1710. In a basic configuration, computing device 1710 may include a stationary computing device or a mobile computing device. Computing device 1710 typically includes at least one processing unit 1720 and system memory 1730. Depending on the exact configuration and type of computing device, system memory 1730 may be volatile (such as RAM), non-volatile (such as ROM, flash memory, and the like) or some combination of the two. System memory 1730 typically includes operating system 1732, one or more applications 1734, and may include program data 1736.

Computing device 1710 may also have additional features or functionality. For example, computing device 1710 may also include additional data storage devices (removable and/or non-removable) such as, for example, magnetic disks, optical disks, tape, interchangeable nonvolatile memory devices, etc. Such additional storage is illustrated in FIG. 17 by removable storage 1740 and non-removable storage 1750. Computer storage media may include volatile and non-volatile, removable and non-removable media implemented in any method or technology for storage of information, such as computer readable instructions, data structures, program modules or other data. System memory 1730, removable storage 1740 and non-removable storage 1750 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, nonvolatile memory cards, or any other medium which can be used to store the desired information and which can be accessed by computing device 1710. Any such computer storage media may be part of device 1710. Computing device 1710 may also have input device(s) 1760 such as a keyboard, which may be operated according to an embodiment of a keyboard scan disclosed herein, mouse, pen, voice input device, touch input device, etc. Output device(s) 1770 such as a display, speakers, printer, etc. may also be included.

Computing device 1710 also contains communication connection(s) 1780 that allow the device to communicate with other computing devices 1790, such as over a network or a wireless network. Communication connection(s) 1780 is an example of communication media. Communication media typically embodies computer readable instructions, data structures, program modules or other data in a modulated data signal such as a carrier wave or other transport mechanism and includes any information delivery media. The term "modulated data signal" may include a signal that has one or more of its characteristics set or changed in such a manner as to encode information in the signal. By way of example, and not limitation, communication media may include wired media such as a wired network or direct-wired connection, and wireless media such as acoustic, RF, infrared and other wireless media. The term computer readable media as used herein includes both storage media and communication media.

The above specification, examples and data provide a complete description of the manufacture and use of the composition of the keyboard scan. Because many embodiments of the keyboard scan can be made without departing from the spirit and scope of the keyboard scan, the keyboard scan resides in the claims hereinafter appended.

The invention claimed is:

1. A method, comprising:
applying a first signal to a plurality of first lines;
applying a second signal to a plurality of second lines;
identifying at least one of the second lines as having a signal different from the second signal;
applying a scan signal to the identified second line;
identifying at least one first line presenting a signal indicating the at least one first line is in contact with the identified second line applying the scan signal, wherein at least one of a plurality of keys is identifiable as causing the identified second line and the least one identified first line to be coupled; and
determining if more than one of the first lines presents a signal indicating contact with the identified second line applying the scan signal; and when more than one of the first lines presents a signal indicating contact with the identified second line applying the scan signal, determining whether the plurality of identified second lines differs from a stored list of the identified second lines.

2. The method of claim 1, further comprising, upon identifying the at least one second line, for a predetermined interval: applying an active first signal to the first lines, wherein the active first signal is applied by coupling the first lines to a source of the first signal; and applying an active second signal to the second lines, wherein the active second signal is applied by coupling the second lines to a source of the second signal.

3. The method of claim 1, further comprising upon identifying a plurality of second lines presenting a signal different from the second signal, tracking each of a plurality of the identified second lines.

4. The method of claim 3, wherein the tracking of each of the plurality of identified second lines includes storing a list of each of the identified second lines.

5. The method of claim 4, further comprising: for each of the plurality of identified second lines, identifying a next second line to which the scan signal has not been applied; electrically decoupling each of the plurality of identified second lines other than the next identified second line from the source of the second signal; and applying the scan signal to the next second line.

6. The method of claim 5, further comprising reapplying the first signal to each of the plurality of first lines before applying the scan signal to the next identified second line.

7. The method of claim 1, wherein one of: the plurality of first lines includes a plurality of row lines and the plurality of second lines includes a plurality of column lines; and the plurality of first lines includes a plurality of column lines and the plurality of second lines includes a plurality of row lines.

8. An apparatus, comprising:
a first line driver configured to apply a first signal to a plurality of first lines;
a second line driver configured to:
apply a second signal to a plurality of second lines;
monitor the second lines; and
upon detecting a signal different from the second signal on at least one of the plurality of second lines, the second line driver configured to initiate a scan of a keyboard, wherein the apparatus is further configured to:
engage the first line driver and the at least one second line driver to create a short-circuit for a predetermined interval to clear crosstalk between any of the plurality of first lines and the plurality of second lines;

identify at least one second line presenting a signal different from the second signal; apply a scan signal to the at least one identified second line; and identify at least one first line presenting a signal different from the first signal indicating the identified second line is in electrical contact with the at least one identified first line, wherein a combination of the at least one identified second line and the at least one identified first line indicates at least one key of the keyboard that has been actuated.

9. The apparatus of claim 8, wherein the one of:

the first signal includes a high-level voltage signal and the second signal includes a low-level voltage signal; and the first signal includes a low-level voltage signal and the second signal includes a high-level voltage signal.

10. The apparatus of claim 9, wherein one of: the first signal includes a first active signal configured to be applied by coupling each of the first lines to a voltage source presenting one of the high-level voltage signal and the low-level voltage signal, and the second signal includes a second passive signal applied by resistively coupling each of the second lines to an opposite of the voltage source coupled with the first lines; and the first signal includes a first passive signal configured to be applied by resistively coupling each of the first lines to a voltage source presenting one of the high-level voltage signal and the low-level voltage signal, and the second signal includes an active second signal applied by coupling each of the second lines to an opposite of the voltage source coupled with the first lines.

11. The apparatus of claim 10, wherein the scan signal includes a level that is the same as the second signal and one of: when the second signal includes an active signal, the scan signal includes a passive signal; and when the second signal includes a passive signal, the scan signal includes an active signal.

12. The apparatus of claim 10, further comprising configuring the apparatus to: apply an active first signal to the first lines; and apply an active second signal to the second lines.

13. The apparatus of claim 10, wherein the scan signal includes a signal having a same voltage level as a second signal and includes one of: an active scan signal when the first signal includes the first active signal; and a passive scan signal when the first signal includes the first passive signal.

14. The apparatus of claim 8, wherein the apparatus is further configured, upon applying the scan signal to the identified second line, to remove the first signal from the first lines.

15. The apparatus of claim 8, further comprising upon identifying a plurality of second lines presenting a signal different from the second signal, to track each of the plurality of identified second lines.

16. The apparatus of claim 15, further comprising a storage device, the storage device being configured to track each of the plurality of identified second lines.

17. The apparatus of claim 16, wherein the apparatus is further configured to: for each of the plurality of identified second lines, to identify a next identified second line to which the scan signal has not been applied; electrically decouple each of the plurality of identified second lines other than the next identified second line from a source of the second signal; and apply the scan signal to the next identified second line.

18. The apparatus of claim 17, wherein the apparatus is further configured to reapply the first voltage to each of the plurality of first lines before applying the scan signal to the next identified second line.

19. The apparatus of claim 16, further comprising a key masking detection mechanism, the key masking detection mechanism being configured to: determine if more than one of the first lines presents a signal indicating contact with the identified second line applying the scan signal; and when more than one of the first lines presents a signal indicating contact with the identified second line applying the scan signal, determine whether the plurality of identified second lines differs from the stored list of the identified second lines.

20. The apparatus of claim 8, wherein one of: the plurality of first lines includes a plurality of row lines and the plurality of second lines includes a plurality of column lines; and the plurality of first lines includes a plurality of column lines and the plurality of second lines includes a plurality of row lines.

21. A method, comprising:

identifying a first line as presenting a first signal different from a second signal present on at least one other line associated with the first line;

applying a scan signal to the identified first line;

identifying at least one second line presenting a signal indicating the at least one second line is in contact with the identified first line applying the scan signal, wherein at least one of a plurality of keys is identifiable as causing the identified second line and the least one identified first line to be coupled; and determining if more than one of the first lines presents a signal indicating contact with the identified second line applying the scan signal; and when more than one of the first lines presents a signal indicating contact with the identified second line applying the scan signal, determining whether the plurality of identified second lines differs from a stored list of the identified second lines.

* * * * *